US009356026B2

(12) United States Patent
Sunamura et al.

(10) Patent No.: US 9,356,026 B2
(45) Date of Patent: May 31, 2016

(54) SEMICONDUCTOR DEVICE AND SEMICONDUCTOR DEVICE MANUFACTURING METHOD

(71) Applicant: RENESAS ELECTRONICS CORPORATION, Tokyo (JP)

(72) Inventors: Hiroshi Sunamura, Kanagawa (JP); Kishou Kaneko, Kanagawa (JP); Naoya Furutake, Kanagawa (JP); Shinobu Saitou, Kanagawa (JP); Yoshihiro Hayashi, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/875,747

(22) Filed: Oct. 6, 2015

(65) Prior Publication Data

US 2016/0027925 A1 Jan. 28, 2016

Related U.S. Application Data

(62) Division of application No. 14/025,978, filed on Sep. 13, 2013.

(30) Foreign Application Priority Data

Sep. 14, 2012 (JP) ................................ 2012-203558
Apr. 11, 2013 (JP) ................................ 2013-082747

(51) Int. Cl.
*H01L 21/02* (2006.01)
*H01L 21/84* (2006.01)
*H01L 27/092* (2006.01)
*H01L 29/812* (2006.01)

(52) U.S. Cl.
CPC .......... *H01L 27/0922* (2013.01); *H01L 29/812* (2013.01)

(58) Field of Classification Search
CPC .......................... H01L 27/0922; H01L 29/812
USPC .......................................... 257/282; 438/159
See application file for complete search history.

(56) References Cited

U.S. PATENT DOCUMENTS

| | | | |
|---|---|---|---|
| 8,378,341 B2 | 2/2013 | Hayashi et al. | |
| 2010/0038619 A1 | 2/2010 | Tada et al. | |
| 2010/0148171 A1 | 6/2010 | Hayashi et al. | |
| 2014/0077206 A1 * | 3/2014 | Sunamura ........... | H01L 21/8254 257/43 |

FOREIGN PATENT DOCUMENTS

| | | |
|---|---|---|
| JP | 2010-141230 A | 6/2010 |
| WO | WO 2010/010802 A1 | 1/2010 |

OTHER PUBLICATIONS

Ogo, Yoichi et.al., "p-channel thin-film transistor using p-type oxide semiconductor, SnO", Appl.Phys.Lett., No. 93, 032113 (2008).
Yabuta, Hisato et.al., "Sputtering formation of p-type SnO thin-film transistors on glass toward oxide complimentary circuits", Appl. Phys.Lett., No. 97, 072111 (2010).

* cited by examiner

*Primary Examiner* — Calvin Lee
(74) *Attorney, Agent, or Firm* — Shapiro, Gabor and Rosenberger, PLLC

(57) ABSTRACT

A semiconductor device has a p-type metal oxide semiconductor layer; a source electrode connected with the p-type metal oxide semiconductor layer; a drain electrode connected with the p-type metal oxide semiconductor layer; and a gate electrode arranged to oppose to a part of the p-type metal oxide semiconductor layer. The gate electrode and the drain electrode are separated from each other in a top view.

1 Claim, 22 Drawing Sheets

SEMICONDUCTOR DEVICE AND SEMICONDUCTOR DEVICE MANUFACTURING METHOD

CROSS-REFERENCE

This application claims priorities on convention based on Japanese Patent Applications JP 2012-203558 and JP 2013-082747. The disclosures of them are incorporated herein by reference.

TECHNICAL FIELD

The present invention relates to a semiconductor device and a semiconductor device manufacturing method. Especially, the present invention relates to a semiconductor device having a p-type metal oxide semiconductor layer and a semiconductor device manufacturing method.

BACKGROUND ART

As an active wiring line device by a technique of forming a transistor in a wiring layer, a CMOS (Complementary Metal Oxide The semiconductor) inverter is sometimes formed. By using the CMOS inverter, a pass-through current can be restrained and power saving can be achieved, compared with a case where only a NMOS transistor or a PMOS transistor is used. In order to realize the CMOS inverter, a p-type metal oxide transistor is required in addition to an n-type metal oxide transistor. Also, it is desirable that the process in which they are formed does not have an influence on a wiring layer.

In relation to the p-type metal oxide transistor, Patent Literature 1 and Non-Patent Literature 1 discloses a transistor which has a tin oxide (SnO) film formed on an YSZ substrate by an epitaxial growth method in a channel layer. Also, Non-Patent Literature 2 discloses a technique of forming a polycrystalline SnO film on a $SiO_2$ substrate by a sputtering method, to use it as a channel. In addition, it discloses a technique of obtaining a polycrystalline SnO film by carrying out post-deposition anneal (PDA).

On the other hand, as for the structure of a transistor, a semiconductor device is disclosed in Patent Literature 2. The semiconductor device includes a semiconductor substrate; an insulating layer formed on the semiconductor substrate; a first wiring layer having a first wiring line embedded in a surface portion of the insulating layer; a semiconductor layer provided on the first wiring layer; a gate insulating film provided on or under the semiconductor layer; and a gate electrode provided to oppose to the semiconductor layer through the gate insulating film.

CITATION LIST

[Patent Literature 1] WO 2010/010802A1

[Patent Literature 2] JP 2010-141230A

[Non-Patent Literature 1] Ogo et al., Applied Physics Letters No. 93, 2008, page 032113

[Non-Patent Literature 2] Yabuta et al., Applied Physics Letters, No. 97, 2010, page 072111

SUMMARY OF THE INVENTION

It is desired that a transistor has a large ON/OFF ratio. The ON/OFF ratio indicates a ratio of the drain current in an ON state to the drain current in an OFF state. However, it is difficult to attain an enough ON/OFF ratio in the p-type metal oxide transistor. FIG. 1 is a diagram showing a relation of drain current (−Id) and gate voltage (VG) in the p-type transistor according to Non-Patent Literature 2. FIG. 1 shows a drain current to VG in the range of −200 V to +100 V. The drain current changes for one digit in this range. If a ratio the maximum value of the drain current to the minimum value thereof is defined as the ON/OFF ratio, the ON/OFF ratio is about 1 digit. It is desirable for practical use that the ON/OFF ratio is equal to or more than 4 digits.

The inventors thought that a cause of reduction of the ON/OFF ratio in the p-type metal oxide transistor was in the formation of the n-type semiconductor component. Hereinafter, this point will be described.

Metal which is contained in the metal oxide semiconductor sometimes can take a plurality of states whose oxidation number is different. Also, depending on a kind of metal, the p-type semiconductor sometimes changes to the n-type semiconductor. FIG. 2 is a diagram schematically showing the change of the oxidation state. As shown in FIG. 2, a $SnO_2$ layer 2 is formed on the surface of the SnO layer 1. For example, the exposure to atmosphere causes change from SnO to $SnO_2$. The SnO layer is the p-type semiconductor but the $SnO_2$ layer is the n-type semiconductor. Also, there is a case that $Cu_2O$ changes into CuO. $Cu_2O$ is the p-type semiconductor but CuO is the n-type semiconductor.

FIG. 3 is a sectional view schematically showing an example of the p-type metal oxide transistor 3 in the process of the manufacture. In this p-type metal oxide transistor 3, the SnO film is provided as the p-type semiconductor layer 6. The semiconductor layer 6 is covered with an interlayer insulating film 7. In case of forming of a source electrode and a drain electrode, an opening 4 for the source electrode and an opening 5 for the drain electrode are formed by an interlayer insulating film 7. By the forming these openings, a part of the semiconductor layer 6 is exposed. In the exposure part, the SnO film changes into the $SnO_2$ film. The $SnO_2$ film is the n-type semiconductor as mentioned above. That is, the part of the p-type semiconductor layer 6 changes into the n-type semiconductor.

FIG. 4 is a graph schematically showing an example of a relation of drain current Id and gate voltage Vg. If the semiconductor layer 6 is composed of the p-type semiconductor, as the gate voltage Vg increases, the absolute value of drain current Id reduces. However, if the semiconductor layer 6 is composed of the n-type semiconductor, as the gate voltage Vg increases, the absolute value of drain current Id rises. When an n-type semiconductor is formed in the part of the semiconductor layer 6 as shown in FIG. 2 and FIG. 3, the ON/OFF ratio can be never increased because of the influence of the n-type semiconductor component.

Therefore, the inventors thought that the ON/OFF ratio of the p-type metal oxide transistor could be increased if the influence of the n-type semiconductor component could be reduced, as shown in FIG. 5.

Other problems and new features will become apparent through the description of this Specification and the attached drawings.

The semiconductor device according to one embodiment is composed of a p-type metal oxide semiconductor layer; a source electrode connected with the p-type metal oxide semiconductor layer; a drain electrode connected with the p-type metal oxide semiconductor layer; and a gate electrode arranged to oppose to a part of the p-type metal oxide semiconductor layer. The gate electrode and the drain electrode are separated from each other in a top view.

According to the above one embodiment, the influence of the n-type semiconductor component gives on the ON/OFF ratio can be reduced.

DESCRIPTION OF EMBODIMENTS

Hereinafter, embodiments of the present invention will be described in detail with reference to the attached drawings.

[First Embodiment]

Figure 6:
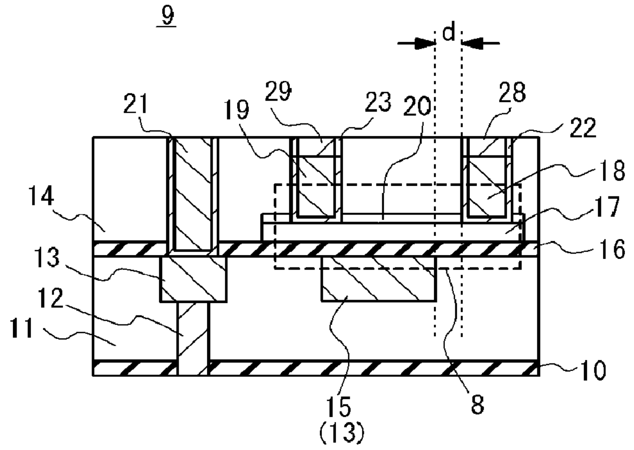
FIG. 6 is a sectional view showing a semiconductor device according to a first embodiment.

FIG. 6 is a sectional view showing a semiconductor device 9 according to a first embodiment.

The semiconductor device 9 is formed on a substrate (not shown) and has a structure that a plurality of wiring layers is laminated. The structure of one wiring layer of the plurality of wiring layers is shown in FIG. 6. As shown in FIG. 6, the semiconductor device is composed of a diffusion preventing film 10, a first insulating layer 11, a first wiring layer 13, a diffusion preventing film 16, a second insulating layer 14 and a p-type metal oxide transistor 8.

The diffusion preventing film 10 is a film to distinguish a lower wiring layer and an upper wiring layer. The first insulating layer 11 is formed on the diffusion preventing film 10. The first wiring layer 13 is arranged in the surface portion of the first insulating layer 11 to be embedded in the first insulating layer 11. A wiring line used as an LSI wiring line is formed in the first wiring layer 13.

A p-type metal oxide transistor 8 is arranged on the first insulating layer 11. Below, the structure of the p-type metal oxide transistor 8 will be described.

The p-type metal oxide transistor 8 is composed of a gate electrode 15, a gate insulating film (the diffusion preventing film 16), a semiconductor layer 17, a source electrode 19 and a drain electrode 18.

The gate electrode 15 is formed in the first wiring layer 13. That is, the gate electrode 15 is arranged in the surface portion of the first insulating layer 11 to be embedded in the first insulating layer 11. For example, the gate electrode 15 and the first wiring layer 13 are realized by a Cu wiring layer and an Al wiring layer.

The diffusion preventing film 16 functions as the gate insulating film. The diffusion preventing film 16 is formed on the first insulating layer 11 to cover the gate pole 15.

The semiconductor layer 17 is arranged on the diffusion preventing film 16. A part of the semiconductor layer 17 overlaps with the gate electrode 15. A hard mask 20 is provided on the semiconductor layer 17. The semiconductor layer 17 has crystalline property. That is, the semiconductor layer 17 is a mono-crystalline or polycrystalline SnO layer.

The diffusion preventing film 16 and the hard mask 20 are covered with the second insulating layer 14.

The source electrode 19 and the drain electrode 18 are arranged to be embedded in the second insulating layer 14, respectively. The source electrode 19 and the drain electrode 18 are connected with the semiconductor layer 17 at the lower bottom sections, respectively. Also, the source electrode 19 and the drain electrode 18 are embedded in openings formed in the second insulating layer 14 through a barrier layer 23 and a barrier film 22, respectively. It should be noted that the source electrode 19 is connected with a pad 29 at the upper end section. In the same way, the drain electrode 18 is connected with a pad 28 at the upper end section. The pad 29 and the pad 28 are exposed from the second insulating layer 14 in the surface portion of the second insulating layer 14, respectively.

In the top view, the gate electrode 15 and the drain electrode 18 are separated from each other by d.

It is possible to improve an ON/OFF ratio of the p-type metal oxide transistor 8 because the gate electrode 15 and the drain electrode 18 are separated. Hereinafter, this point will be described.

Figure 3:
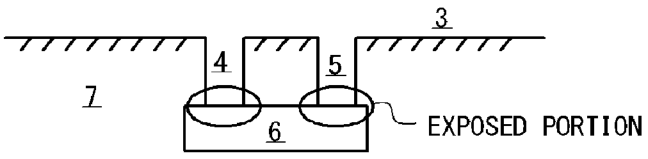
FIG. 3 is a sectional view schematically showing an example of a p-type metal oxide transistor 3 in the process of manufacture.
Figure 4:
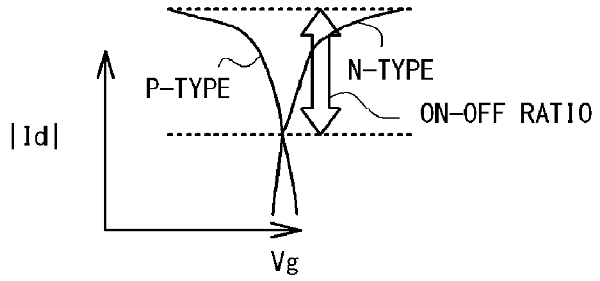
FIG. 4 is a graph showing an example of the relation of drain current Id and gate voltage Vg.
Figure 5:
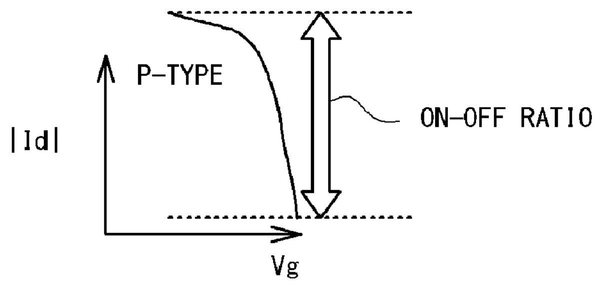
FIG. 5 is a graph schematically showing an example of a relation of drain current Id and gate voltage Vg.

In the process of manufacturing the semiconductor device 9, as described with reference to FIG. 3, the semiconductor layer 17 is exposed to the atmosphere in case of forming of the source electrode and the drain electrode. As a result, there is a case that the p-type semiconductor layer changes into an n-type semiconductor layer in the exposure part. That is, there is a case that the n-type semiconductor layer is formed in the connection part of the semiconductor layer 17 and the drain electrode 18. In the present embodiment, the part which faces the gate electrode 15 and the connection part of the semiconductor layer 17 and the drain electrode 18 are physically separated. As a result, the influence of the n-type semiconductor layer on the operation of the transistor is restrained and it seems to become possible to improve the ON/OFF ratio.

Next, referring to FIG. 7A to FIG. 7C and FIG. 8, the relation of the distance d and the ON/OFF ratio will be described.

Figure 7A:
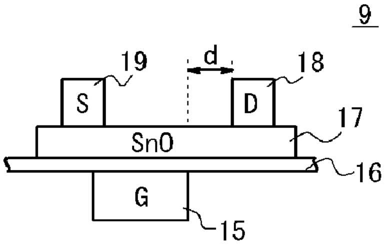
FIG. 7A is a diagram schematically showing a semiconductor device according to the first embodiment.

FIG. 7A is a diagram schematically showing a semiconductor device 9 according to the present embodiment. As previously mentioned, in the present embodiment, the gate electrode 15 and the drain electrode 18 are separated by the distance d in the top view.

Figure 7B:
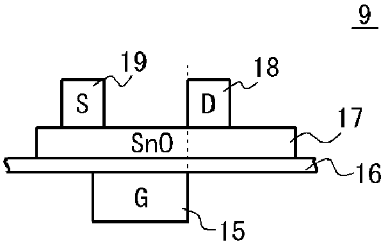
FIG. 7B is a diagram schematically showing the semiconductor device according to a comparison example 1.

On the other hand, FIG. 7B is a diagram schematically showing the semiconductor device 9 according to a comparison example 1. In the comparison example 1, an end of the gate electrode 15 coincides with an end of the drain electrode 18 in position in the top view. That is, the distance d is zero.

Figure 7C:
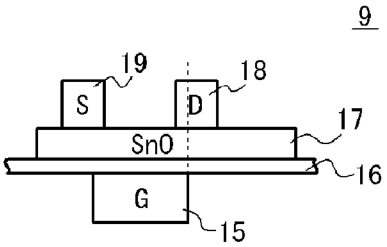
FIG. 7C is a diagram schematically showing the semiconductor device according to a comparison example 2.

Also, FIG. 7C is a diagram schematically showing the semiconductor device 9 according to a comparison example 2. In the p-type metal oxide transistor 8 of the comparison example 2, a part of the gate electrode 15 overlaps with a part of the drain electrode 18 in the top view.

Figure 8:
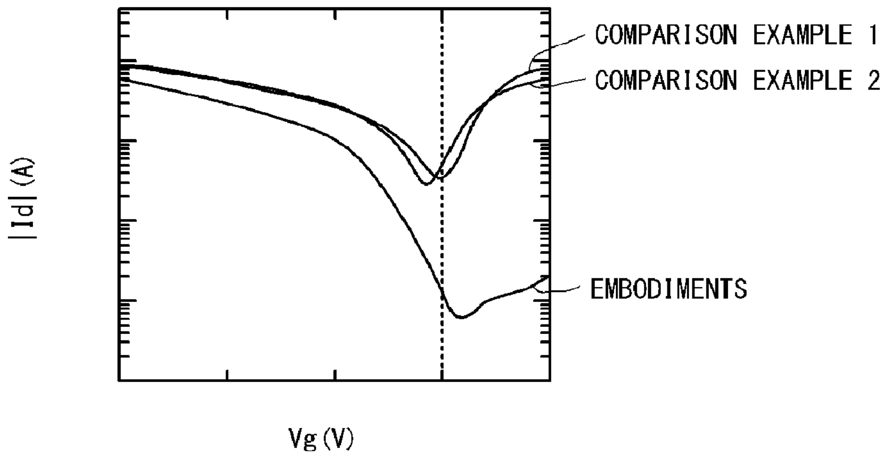
FIG. 8 is a graph showing a relation of gate voltage Vg and the absolute value of drain current Id.

FIG. 8 is a graph showing a relation between gate voltage Vg and an absolute value of drain current Id. The relation of gate voltage Vg and drain current Id in each of the present embodiment (FIG. 7A), the comparison example 1 (FIG. 7B) and the comparison example 2 (FIG. 7C) is shown in FIG. 8.

As shown in FIG. 8, when the present embodiment is compared with the comparison example 1 and the comparison example 2, a variation of the absolute value of the drain current is large. That is, in the present embodiment, it was confirmed that the ON/OFF ratio was improved, compared with the comparison examples 1 and 2. Although not shown, according to the knowledge of the inventors, the ON/OFF ratio changes when the distance d between the gate electrode 15 and the drain electrode 18 changes.

Next, an example of a method of manufacturing the semiconductor device according to the present embodiment will be described.

First, the distance d between the gate electrode and the drain electrode is determined previously so that a target ON/OFF ratio can be attained. Specifically, the relation between the distance d and the ON/OFF ratio is determined, and the distance d when the ON/OFF ratio meets a target value is determined as a design value. The relation between the distance d and the ON/OFF ratio may be determined based on measurement data and may be founded through a simulation and so on.

Next, the semiconductor device is manufactured so that the gate electrode and the drain electrode are separated by the determined distance d. FIG. 9A to FIG. 9E are sectional views showing the manufacturing method of the semiconductor device according to the present embodiment.

Figure 9A:
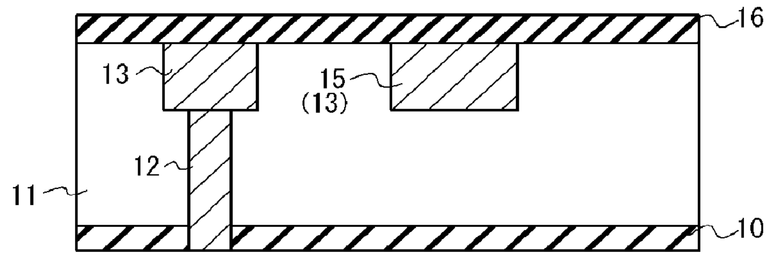
FIG. 9A is a sectional view showing a semiconductor device manufacturing method according to the first embodiment.

As shown in FIG. 9A, the diffusion preventing film 10, the first insulating layer 11, the first wiring layer 13 (the gate electrode 15) and the diffusion preventing film 16 (the gate insulating film) are formed on a substrate (not shown). A via-contact 12 is formed in the first insulating layer 11 to be connected with the first wiring layer 13. These can be formed by using the known technique. It should be noted that the first wiring layer 13 (the gate electrode 15) is formed, for example, as a Cu layer. Also, when the Cu layer is used as the gate electrode 15, for example, a SiN layer, a SiCN layer and so on are used as the diffusion preventing film 16. The film thickness of the diffusion preventing film is, for example, about 10-50 nm.

Figure 9B:
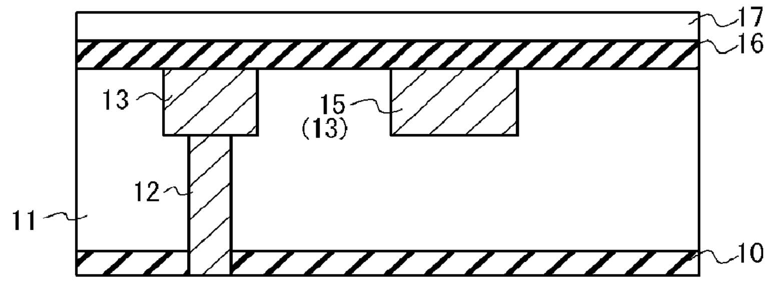
FIG. 9B is a sectional view showing the semiconductor device manufacturing method according to the first embodiment.

Next, as shown in FIG. 9B an oxide semiconductor layer is formed as the semiconductor layer 17 on the diffusion preventing film 16 by a sputtering and so on. As the semiconductor layer 17, a SnO layer is used. For example, the film thickness of the semiconductor layer 17 is about 10-50 nm. In case of the sputtering, the SnO layer after film forming is in an amorphous condition.

Figure 9C:
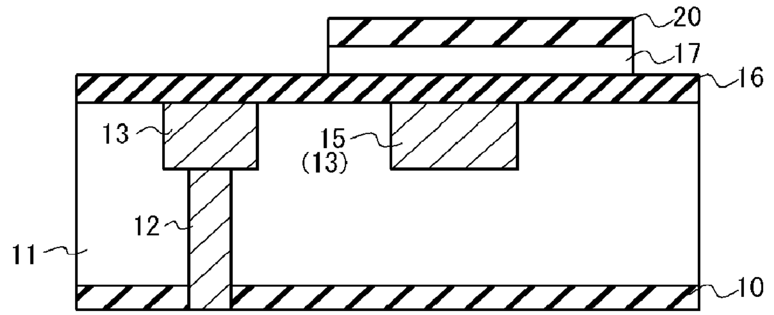
FIG. 9C is a sectional view showing the semiconductor device manufacturing method according to the first embodiment.

Next, as shown in FIG. 9C the hard mask 20 is formed, on the semiconductor layer 17. Moreover, the semiconductor layer 17 and the hard mask 20 are processed to have desired shapes by a photolithography process and a dry etching process. For example, an insulating film such as a $SiO_2$ layer, a SiOC layer, a C layer and a SiN layer is used as the hard mask 20. These films may be combined. It is desirable that the film thickness of the hard mask 20 is about 30-200 nm.

Next, the semiconductor layer 17 is subjected to heat-treatment (PDA) so that the semiconductor layer 17 changes from the amorphous state into a polycrystalline state. It is desirable that the temperature of the PDA is in a range from 200° C. to 400° C. and more desirably that it is in a range from 250° C. to 380° C.

Figure 9D:
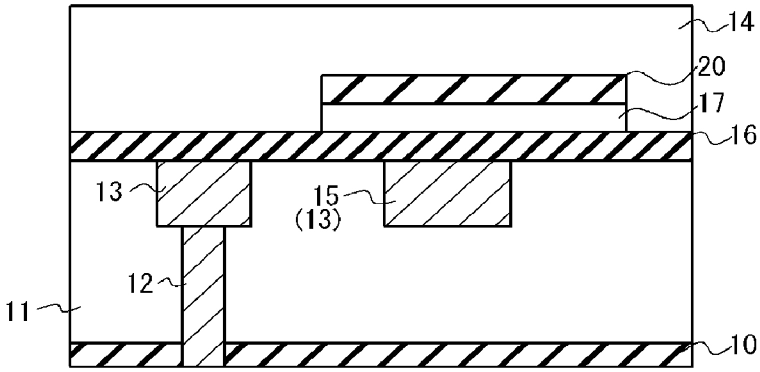
FIG. 9D is a sectional view showing the semiconductor device manufacturing method according to the first embodiment.

Next, to cover the hard mask 20 and the semiconductor layer 17 as shown in FIG. 9D, the second insulating layer 14 is formed.

Figure 9E:
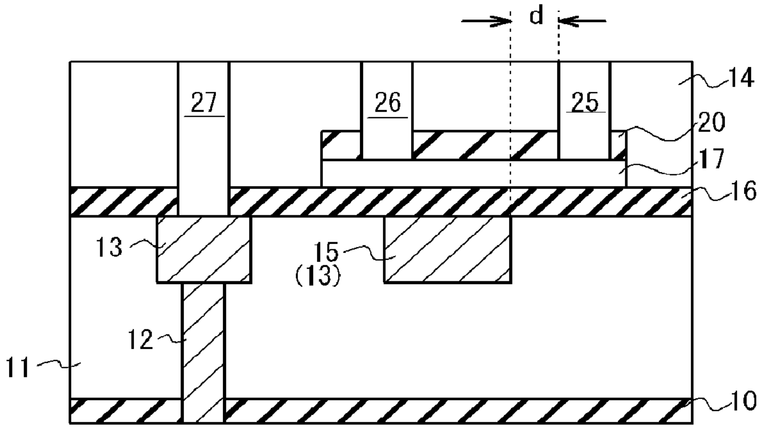
FIG. 9E is a sectional view showing the semiconductor device manufacturing method according to the first embodiment.

Next, as shown in FIG. 9E, an opening 25, an opening 26 and an opening 27 are formed. The opening 25 is an opening for the drain electrode and is formed to pass through the second insulating layer 14 and the hard mask 20. The opening 26 is an opening for the source electrode and is formed to pass through the second insulating layer 14 and the hard mask 20. The opening 27 is an opening to form a via-contact connected with the first wiring layer 13 and is formed to pass through the second insulating layer 14 and the diffusion preventing film 16. These openings can be formed at a same time by a lithography process and so on. If the second insulating layer, the hard mask 20, the semiconductor layer 17 and the diffusion preventing film 16 are transparent, the position of the gate electrode 15 can be determined by using a computer, a camera and so on at the time of the lithography process. Or, a mark for position identification may be formed previously. In this case, a position of the opening 25 is determined such that the gate electrode 15 and the opening 25 are separated from each other by the determined distance d in the top view. Then, the opening 25 can be formed at the determined position. By executing the lithography process based on the position of the gate electrode 15, the distance d between the drain electrode and the gate electrode 15 can be controlled in the precision of the lithography process.

After that, a barrier film is formed inside of each of the opening 25, the opening 26 and the opening 27 and then a conductive material is embedded in each opening. Thus, a via-contact 21, the source electrode 19 and the drain electrode 18 are formed as shown in FIG. 6 and the semiconductor device 9 having the p-type metal oxide transistor 8 is manufactured.

According to the above-mentioned manufacturing method, in case of forming the opening 25, a part of the semiconductor layer 17 is exposed to the atmosphere. As a result, there is a possibility that the part of the semiconductor layer 17 changes to the n-type semiconductor layer ($SnO_2$) from the p-type semiconductor layer (SnO). However, because the gate electrode 15 and the drain electrode 18 are separated in the top view in the present embodiment, the influence of the n-type semiconductor layer on the ON/OFF ratio can be restrained.

It should be noted that in the above-mentioned example, a case that heat-treatment (PDA) is performed before forming the second insulating layer 14 after forming of the hard mask 20 has been described. However, the PDA may be performed after forming the second insulating layer 14 or before SnO processing immediately after forming the SnO layer and the hard mask.

Also, in the present embodiment, a case that the semiconductor layer 17 is the SnO layer has been described. However, if the semiconductor layer 17 is a p-type oxide semiconductor layer, it is not limited to the SnO layer. Especially, if the semiconductor layer 17 contains a metal oxide showing an n-type semiconductor characteristic when an oxidation number is changed, the present embodiment can be effectively applied. For example, even if the ZnO layer, the ZnAlO layer, the ZnCuO layer, the NiO layer and the $Cu_2O$ layer, which are doped and used as the semiconductor layer 17, the effect of the present embodiment can be attained.

It should be noted that in the present embodiment, a case where the gate electrode 15 is provided in the same layer as the wiring layer has been described. By adopting such a structure, it becomes possible to provide the p-type metal oxide transistor 8 in the same layer as the wiring layer. Also, the diffusion preventing film and the gate insulating film can be made common. Moreover, the LSI wiring lines and the gate electrode of the transistor can be made in the identical process. The present embodiment is favorable from these viewpoints. However, the gate electrode 15 does not have to be provided in the same layer as the wiring layer, and if the gate electrode 15 and the drain electrode 18 are separated from each other in the top view, the gate electrode 15 may be provided on the semiconductor layer 17.

Also, in an example shown in FIG. 6, and FIG. 9A to FIG. 9E, because the Cu wiring layer is used as the wiring layer, the via-contact is provided under the wiring layer and a ditch wiring line is provided on the via-contact. However, when an Al wiring layer is used as the wiring layer, after the Al wiring layer is provided, the Al wiring layer is covered with an oxide film, a flattening process is carried out, the via-hole is opened and a contact plug W, and so on is embedded. Therefore, the via-contact is provided on the wiring layer.

[Second Embodiment]

Figure 10:
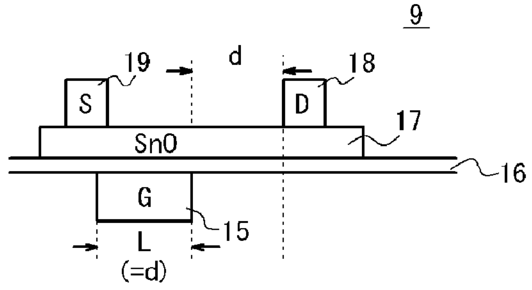
FIG. 10 is a sectional view schematically showing a p-type metal oxide transistor according to a second embodiment.

Next, a second embodiment of the present invention will be described. FIG. 10 is a sectional view schematically showing the p-type metal oxide transistor 8 according to the present embodiment. In the present embodiment, the length L of the gate electrode 15, and the distance d between the gate electrode 15 and the drain electrode 18 are devised.

As shown in FIG. 10, the length L of the gate electrode 15 (the gate length) is set to be equal to the distance d between the gate electrode 15 and the drain electrode 18 or to meet a relation of $d>L$. For example, the length L and the distance d are 0.5 μm.

Figure 1:
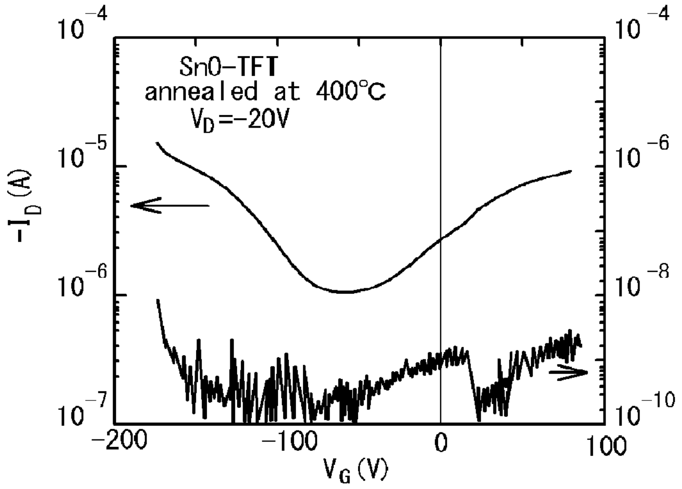
FIG. 1 is a diagram showing a relation of drain current (−Id) of gate voltage (Vg) in a p-type transistor according to Non-Patent Literature 2.
Figure 2:
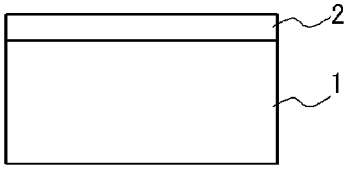
FIG. 2 is a diagram schematically showing a change of an oxidation state.

When $d\geq L$, the ON/OFF ratio can be remarkably improved. According to the knowledge of the inventors, when the distance d is equal to the length L of the gate electrode, it was confirmed that a value of about 5-digit could be obtained as the ON/OFF ratio, and the ON/OFF ratio could be improved remarkably compared with a conventional example (FIG. 1).

[Third Embodiment]

Next, a third embodiment of the present invention will be described.

In the present embodiment, the semiconductor device manufacturing method is devised to the above-mentioned embodiments. Because the other points than the devised point may be the same as those in the above-mentioned embodiments, a detailed description will be omitted.

Figure 11:
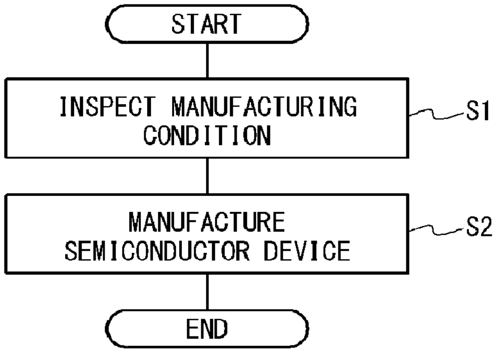
FIG. 11 is a flow chart showing the semiconductor device manufacturing method according to a third embodiment.

FIG. 11 is a flow chart showing the manufacturing method of the semiconductor device according to the present embodiment. In the present embodiment, first, the search of a manufacturing condition is carried out (Step S1). Specifically, the manufacturing condition when the threshold voltage of the p-type metal oxide transistor is set to a desired value is searched. After that, at the condition searched at step S1, the semiconductor device is formed (Step S2). The manufacturing method at step S2 is the same as that of the first embodiment (FIG. 9A to FIG. 9E).

Hereinafter, the search of the manufacturing condition at step S1 will be described.

The threshold voltage of the p-type metal oxide transistor 8 depends on a carrier concentration in the semiconductor layer 17. The carrier concentration in the semiconductor layer 17 depends on the manufacturing condition. Therefore, in the present embodiment, a relation between the manufacturing condition and the threshold voltage is found previously. Then, the manufacturing condition is searched based on the found relation to attain the threshold voltage.

Figure 12:
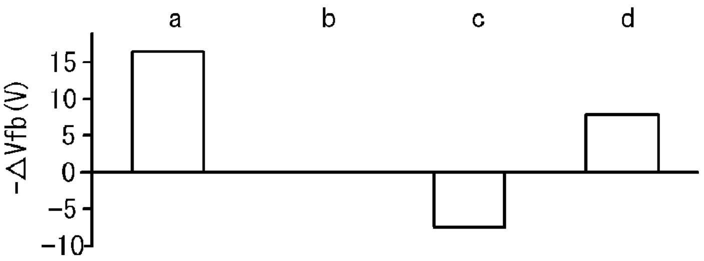
FIG. 12 is a diagram showing a relation of manufacturing condition and flat band voltage Vfb.

In the present embodiment, a temperature at the heat-treatment (PDA) as the manufacturing condition is searched. FIG. 12 is a diagram showing a relation of the manufacturing condition and a variation ($-\Delta Vfb$) of the threshold voltage (flat band voltage Vfb). In FIG. 12, the graph a shows a variation from a reference value of the flat band voltage Vfb in the transistor according to the experiment example 1. The graph b shows a variation from the reference value of the flat band voltage Vfb in the transistor according to the experiment example 2. The graph c shows a variation from the reference value of the flat band voltage Vfb in the transistor according to the experiment example 3. It should be noted that Vfb of experiment example 2 was used as the reference value of Vfb. That is, in the experiment example 2, the variation ($-\Delta Vfb$) is zero. Also, in the experiment example 1, the variation ($-\Delta Vfb$) is positive and shows that the flat band voltage is shifted to the negative side from that in the experiment example 2. It should be noted that the heat-treatment temperature of the experiment example 2 is higher than the heat-treatment temperature of the experiment example 1 and the heat-treatment temperature of the experiment example 3 is higher than the heat-treatment temperature of the experiment example 2.

As shown in FIG. 12, when the heat-treatment temperatures are different in comparison of the experiment examples 1 to 3 (a to c), it could be understood that the threshold voltage (the flat band voltage) changes. This is because the carrier concentration in the semiconductor layer 17 changes depending on the difference of the heat-treatment temperature. Specifically, when the heat-treatment temperature is low, the flat band voltage shifts to the negative side and the threshold voltage of the transistor also shifts to the negative side.

Therefore, in the present embodiment, a heat-treatment temperature when a target threshold voltage is obtained is determined based on the relation shown in FIG. 12. After that, the PDA is performed at the determined heat-treatment temperature when the semiconductor device at step S2 is formed.

According to the present embodiment, the p-type metal oxide transistor 8 having the desired threshold voltage can be obtained. For example, in the p-type metal oxide transistor 8 used for a power system, the realization of a normally off operation is requested. The normally off operation shows an operation in which the transistor is in the off state when gate voltage Vg is 0 V. To realize the normally off operation, it is necessary that the threshold voltage is negative. According to the present embodiment, the normally off operation can be realized by adopting such a heat-treatment temperature that the threshold voltage becomes negative.

It should be noted that in the present embodiment, a case where the heat-treatment temperature as the manufacturing condition is searched has been described. However, the manufacturing condition to be searched is not limited to the heat-treatment temperature. Another parameter which has an influence on the carrier concentration may be searched as the manufacturing condition. The flat band voltage Vfb in the experiment example 4 is shown in FIG. 12 as the graph d in addition to experiment examples 1 to 3. In the experiment example 4, the oxygen concentration at the forming the semiconductor layer 17 by sputtering is changed from that of the experiment example 2. The other conditions are the same as those of the experiment example 2. As shown in FIG. 12, if the experiment example 2 (graph b) and the experiment example 4 (graph d) are compared with each other, it could be understood that the flat band voltage changes is changed based on the oxygen concentration in the sputtering. Specifically, when the oxygen concentration is high, the flat band voltage is shifted to the negative side and the threshold voltage of the transistor is shifted to the negative side. This is because the carrier concentration in the semiconductor layer 17 changes depending on the oxygen concentration in the sputtering. Therefore, the oxygen concentration in the sputtering is searched as the manufacturing condition at the step S1, and the sputtering may be carried out in the oxygen concentration of the search result at the step S2.

Also, besides, the carrier concentration is affected by a heat-treatment time. Therefore, the heat-treatment time may be searched so as to attain the target threshold voltage, instead of the heat-treatment temperature.

[Fourth Embodiment]

Next, a fourth embodiment of the present invention will be described.

In the above-mentioned embodiments, a case where the semiconductor layer 17 has a crystalline property has been described. That is, a case where the semiconductor layer 17 changes from the amorphous state into the crystalline state through the heat-treatment (PDA) in the manufacturing has been described. On the other hand, in the present embodiment, the temperature at which the semiconductor layer 17 maintains the amorphous state at the time of heat-treatment (PDA), or the PDA condition is adopted. That is, the SnO layer in amorphous state is used as the semiconductor layer 17. Because the other conditions may be same as those of the above-mentioned embodiments, the detailed description is omitted.

When the semiconductor layer 17 has a crystalline property, a deviation of grain size sometimes has an influence on the characteristics of the semiconductor device. On the other hand, if the semiconductor layer 17 is in the amorphous state, the deviation of the grain size never has an influence on the characteristics of the semiconductor device. Thus, the yield of the p-type metal oxide transistor can be substantially improved. However, the p-type metal oxide transistor which uses the SnO layer in the amorphous state as a channel has not been reported heretofore. This is because the SnO layer in the amorphous state does not show the semiconductor property to an extent that it can be used as the p-type metal oxide transistor.

However, the inventors found that the semiconductor characteristics could be given to the semiconductor layer 17 (the SnO layer) in the amorphous state after sputtering by applying the heat-treatment in the temperature and the condition in which the amorphous state is maintained.

That is, in the present embodiment, the condition and the temperature of the heat-treatment in which the amorphous state is maintained are searched and the heat-treatment (PDA) is performed in the temperature and the condition of the search result. Thus, the SnO layer in the amorphous state showing the semiconductor property is obtained. It should be noted that the heat-treatment condition in which the amorphous state is maintained is, for example, a temperature lower than the heat-treatment temperature at which the semiconductor layer 17 is changed to the polycrystalline state.

Figure 13A:
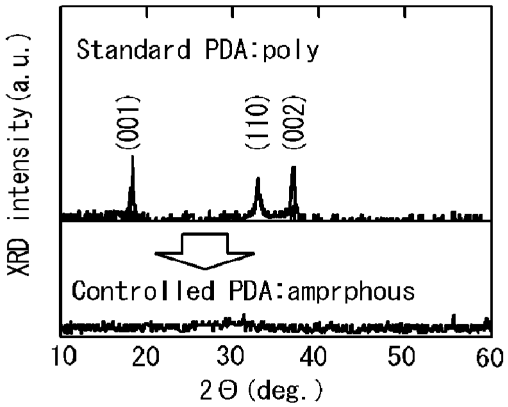
FIG. 13A is a diagram showing an XRD spectrum of the semiconductor layer according to a fourth embodiment.

FIG. 13A is a diagram showing XRD spectrum of the SnO layer produced by the inventors. FIG. 13A shows a result when the heat-treatment is performed in the standard condition, and a result (line b) when the (controlled) heat-treatment is performed on the condition of the search result. As shown in FIG. 13A, in the standard condition, the SnO layer is crystalized. On the other hand, when the heat-treatment is performed on the condition of the search result, a crystal component was not found and it was confirmed that the amorphous state was maintained. It should be noted that although not shown, it was confirmed with TEM and SEM that the SnO layer in the amorphous state was formed.

Figure 13B:
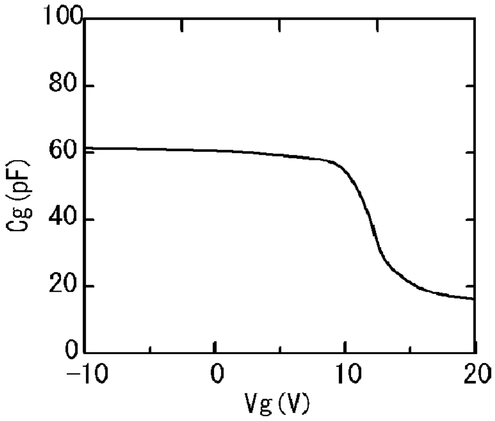
FIG. 13B is a graph showing a relation of gate voltage Vg and gate capacity Cg in a semiconductor layer according to the fourth embodiment.

FIG. 13B is a graph showing a relation of gate voltage Vg and gate capacity Cg in the SnO layer (when the heat-treatment is performed on the condition of the search result) shown in FIG. 13A. As shown in FIG. 13B, as the gate voltage Vg changes, the gate capacity Cg changes. That is, it was confirmed that the transistor operation could be realized in spite of the use of the SnO layer in the amorphous state as the semiconductor layer 17.

Figure 14:
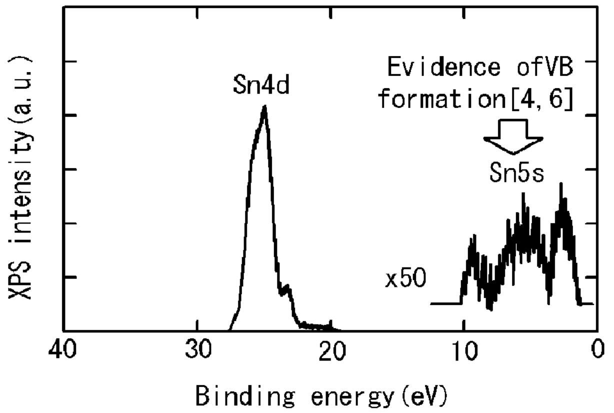
FIG. 14 is a graph showing an XPS spectrum of the semiconductor layer according to the fourth embodiment.

FIG. 14 is a spectrum showing the result of XPS (the X-ray photo-electron spectroscopy) analysis of the SnO layer to which the heat-treatment is performed on the condition of the search result according to the present embodiment. As shown in FIG. 14, in the SnO layer according to the present embodiment, a peak (Sn 5s) as a result of the formation of a valence band was observed in spites of the maintenance of the amorphous state. That is, it was confirmed that the SnO layer functions as the p-type semiconductor layer in spite of the amorphous condition.

It should be noted that according to the knowledge of the inventors, the transistor having a desired threshold voltage can be attained by searching the manufacturing condition even in the present embodiment, like the third embodiment.

[Fifth Embodiment]

Next, a fifth embodiment of the present invention will be described. In the present embodiment, the structure of the gate insulating film 16 is devised. Because the other points of the structure are same as those of the first embodiment, a detailed description is omitted.

Figure 15:
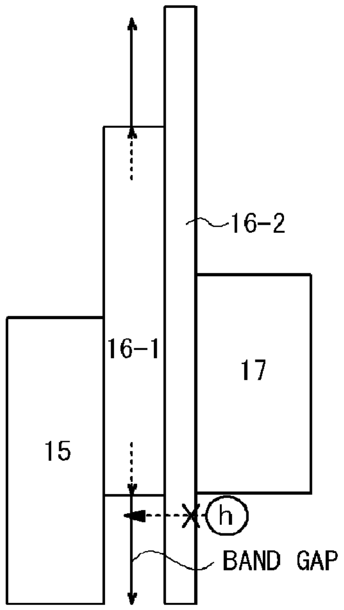
FIG. 15 is a diagram schematically showing the semiconductor device according to a fifth embodiment.

FIG. 15 is a diagram schematically showing the p-type metal oxide transistor 8 according to the present embodiment. In the present embodiment, a first gate insulating film 16-1 and a second gate insulating film 16-2 are provided between the gate electrode 15 and the p-type metal oxide semiconductor layer 17. That is, in the present embodiment, the gate insulating film 16 has a 2-layer structure.

The first gate insulating film 16-1 is provided on the gate electrode 15. When the gate electrode 15 is composed by the Cu wiring line, the Cu diffusion preventing film (e.g. SiN film) is used as the first gate insulating film 16-1.

The insulating film that the band gap is greater than that of the first gate insulating film 16-1 is used as the second gate insulating film 16-2. For example, when the SiN film is used as the first gate insulating film 16-1, the $SiO_2$ film or $Al_2O_3$ film is used as the second gate insulating film 16-2.

In the active wiring line element, the SiN film is generally used as the gate insulating film. However, when the SiN film is used as the gate insulating film, a leak current occurs to the p-type metal oxide transistor conspicuously. In the SiN film, this is because the band gap at the end of the valence band is small comparatively.

On the other hand, in the present embodiment, the gate insulating film has the 2-layer structure. Therefore, the band gap of the gate insulating film can be extended and the leak current can be prevented in the p-type metal oxide transistor.

The film thickness of second gate insulating film 16-2 is 3 to 50 nm, desirably.

[Sixth Embodiment]

Next, a sixth embodiment of the present invention will be described. In the present embodiment, the semiconductor device which has two transistors will be described. Specifically, a case that the semiconductor device is an inverter will be described.

If a function of the semiconductor device can be changed without changing the layout of the semiconductor device formed on the semiconductor substrate, a plurality of types of the semiconductor device having the different functions can be manufactured by using the identical semiconductor substrate. Thus, the manufacturing cost of the semiconductor device can be reduced. Especially, if the device which has a new function in the wiring layer can be formed without changing the layout of the semiconductor device, the function of the semiconductor device can be substantially increased. As such a semiconductor device, the inventors proposed an active element in the wiring layer. If the inverter can be formed as the active element in the wiring layer, an interface which bridges a lower power logic circuit and an external high-voltage equipment can feasibly realized.

In order to realize an inverter, the p-type oxide semiconductor having a good characteristic needs to be formed in the wiring layer in addition to the n-type oxide semiconductor which has been realized conventionally. The inventors studied a device structure and a manufacturing method in which the p-type oxide semiconductor was formed in the wiring layer. However, it was found that it was difficult to form the n-type oxide semiconductor and the p-type oxide semiconductor in an identical wiring layer. Also, the inventors studied an inverter in which only an n-type metal oxide semiconductor was used. However, in this case, it was found that the output voltage Vout of the inverter had been attenuated to a power supply voltage VDD.

Therefore, the inventors studied to increase the amplitude of the output voltage Vout and to form an n-type oxide semiconductor and a p-type oxide semiconductor in an identical wiring layer. As a result, the study led to the present embodiment.

The inverter according to the present embodiment will be described below.

Figure 16:
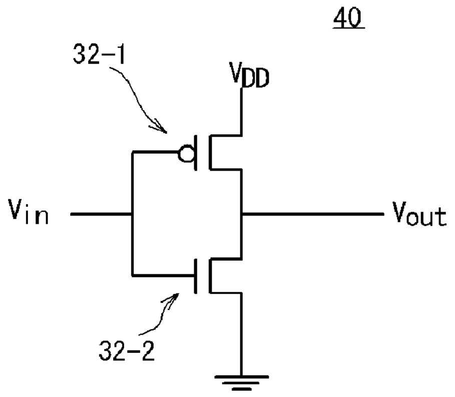
FIG. 16 is a diagram schematically showing the inverter according to a sixth embodiment.

FIG. 16 is a diagram schematically showing an inverter 40 according to the present embodiment. As shown in FIG. 16, the inverter 40 is composed of a first transistor 32-1 and a second transistor 32-2. The first transistor 32-1 functions as a p-type FET. The second transistor 32-2 functions as an -type FET. The source of the first transistor 32-1 is connected with a power supply voltage VDD (a first power supply). The drain of the first transistor 32-1 is connected with an output terminal Vout. The drain of the second transistor 32-2 is connected with the drain (the output terminal Vout) of the first transistor 32-1. The source of the second transistor 32-2 is connected with the ground voltage (a second power supply). The gate of the first transistor 32-1 and the gate of the second transistor 32-2 are connected with an input terminal Vin.

Figure 17:
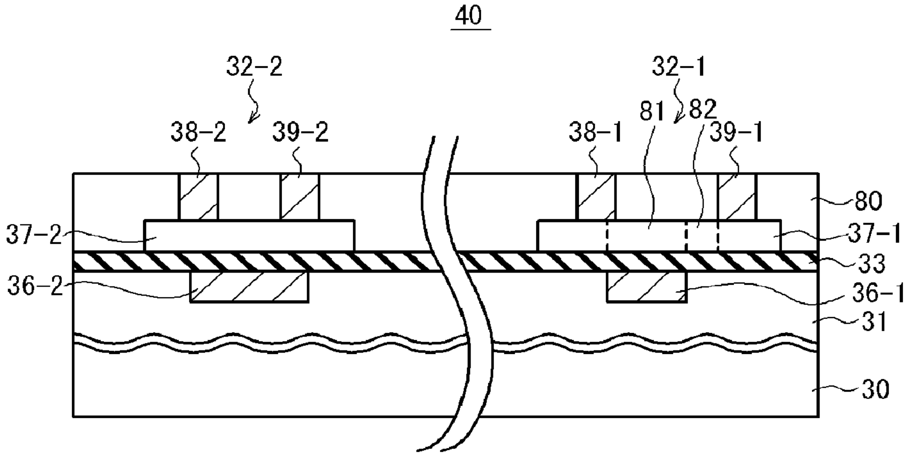
FIG. 17 is a sectional view schematically showing the structure of the inverter.

FIG. 17 is a sectional view schematically showing the structure of the inverter 40. As shown in FIG. 17, the inverter 40 is formed on an insulating layer 31 formed above a substrate 30.

The structure of the first transistor 32-1 is same as the p-type metal oxide transistor 8 (reference to FIG. 7A) of the first embodiment. That is, the first transistor 32-1 has a first gate electrode 36-1, a first p-type metal oxide semiconductor region 37-1, a first source electrode 38-1 and a first drain electrode 39-1. The first gate electrode 36-1 is arranged between the first source electrode 38-1 and the first drain electrode 39-1 in the top view. Also, in the top view, the first gate electrode 36-1 and the first drain electrode 39-1 are separated. It should be noted that a region opposing to the first gate electrode 36-1 is referred to as a gate opposing region 81 in the first p-type metal oxide semiconductor region 37-1. Also, a region between the gate electrode 81 and the first drain electrode 39-1 is referred to as an offset region 82 in the first p-type metal oxide semiconductor region 37-1. The length of the offset region 82 is desirable to be above 0.1 μm and more desirable to be above 0.3 μm, and moreover more desirable to be above 0.5 μm.

On the other hand, the structure of the second transistor 32-2 is same as the transistor described as the comparison example 2 (reference to FIG. 7C) in the first embodiment. That is, the second transistor 32-2 has the second gate electrode 36-2, the second p-type metal oxide semiconductor region 37-2, the second source electrode 38-2 and the second drain electrode 39-2. In the top view, the second gate electrode 36-2 is arranged between the second source electrode 38-2 and the second drain electrode 39-2. Also, in the top view, the second gate electrode 36-2 and the second drain pole 39-2 overlap partially.

The first gate electrode 36-1 and the second gate electrode 36-2 are provided in the identical layer (on same plane). In the same way, the first p-type metal oxide semiconductor region 37-1 and the second p-type metal oxide semiconductor region 37-2 are provided in the identical layer. Also, the first p-type metal oxide semiconductor region 37-1 and the second p-type metal oxide semiconductor region 37-2 are covered with an insulating film 80. The first source electrode 38-1, the first drain electrode 39-1, the second source electrode 38-2 and the second drain electrode 39-2 are embedded in the insulating film 80.

By adopting the above structure, the first transistor 32-1 functions as the p-type transistor, and the second transistor 32-2 functions as the n-type transistor. This point will be described below.

As described with reference to FIG. 8 (embodiment), when the offset region 82 is provided (when the gate electrode and the drain electrode are separated in the top view), the p-type transistor operation showing the good ON/OFF ratio (e.g. 3 digits, or 5 digits depending on an element) can be attained. On the other hand, when the drain electrode and the gate electrode overlap partially as shown in FIG. 8 (the comparison example 2), the n-type component becomes rather larger. When the source electrode of the second transistor 32-2 (the n-type transistor) is connected with the ground voltage as shown in FIG. 16, the voltage Vgs is always positive because the voltage Vg applied by the gate electrode of the second transistor 32-2 is positive. Therefore, the characteristic in the region where the voltage Vg is smaller than 0 V (the region where Vg is smaller than the dotted line in FIG. 8), the operation is not influenced. In the second transistor 32-2, only the characteristics as the n-type transistor can be used.

According to the present embodiment, the first transistor 32-1 operates as the p-type transistor and the second transistor 32-2 operates as the n-type transistor. Therefore, a CMOS inverter can be realized as the inverter 40. As described in the above embodiments, the amplitude of the output voltage Vout from the inverter 40 can be increased, because the p-type transistor having the large ON/OFF ratio can be obtained as the first transistor 32-1. Also, if the threshold value of the first transistor 32-1 as the p-type transistor can be increased, the ON/OFF ratio of the second transistor 32-2 as the n-type transistor can be improved. The threshold voltage can be changed by using the technique which has been described in the above-mentioned embodiments.

It should be noted that the reason why the first transistor 32-1 operates as the p-type transistor is as follows. That is, in the first p-type metal oxide semiconductor region 37-1, an n-type semiconductor layer is formed through the oxidation in the manufacture (e.g. $SnO \rightarrow SnO_2$) in the connection part of the first source electrode 38-1 and the first drain electrode 39-1, as mentioned above. When the gate voltage Vg is negative, a hole-accumulating layer is formed in the gate opposing region 81, in the first p-type metal oxide semiconductor region 37-1. Also, the offset region 82 is the p-type semiconductor layer. Therefore, the first transistor 32-1 seems to operate as an accumulation type p-type FET (PFET). On the other hand, when a positive voltage is applied as the gate voltage Vg, an inversion layer of electrons is formed in the gate opposing region 81. On the other hand, the offset region 82 is as the p-type semiconductor layer. Therefore, the current does not flow between the first source electrode 38-1 and the first drain electrode 39-1. For the above reason, in the first transistor 32-1, the characteristic as the p-type transistor seems to be selectively taken out.

Also, the reason why the second transistor 32-2 has the characteristics of both of the n-type transistor and the p-type transistor is as follows. Like the first p-type metal oxide semiconductor region 37-1, in the second p-type metal oxide semiconductor region 37-2, an n-type semiconductor layer is formed in the connection part of the second source electrode 38-2 and the second drain electrode 39-2 through the oxidation. In the top view, because this n-type component overlaps with the second source electrode 38-2 and the second drain electrode 39-2, the electron inversion layer is formed in the channel region (the region which opposes to the gate electrode 36 in the p-type metal oxide semiconductor region) to electrically connect the source electrode 38-2 and the drain electrode 39-2, when the gate voltage is positive. Thus, the n-type transistor operation seems to happen. On the other hand, the hole-accumulating layer is formed in the second p-type metal oxide semiconductor region 37-2 when the gate voltage Vg is negative. Thus, the second source electrode 38-2 and the second drain electrode 39-2 are electrically connected so that the operation as the p-type transistor could be obtained.

Also, according to the present embodiment, by adjusting the arrangement of the source electrode and the drain electrode in the manufacturing, the n-type transistor and the p-type transistor can be manufactured independently and individually. That is, as shown in FIG. 17 in the present embodiment, the first gate electrode 36-1 and the second gate electrode 36-2 are provided in the identical wiring layer, and the first p-type metal oxide semiconductor region 37-1 and the second p-type metal oxide semiconductor region 37-2 are provided in the identical layer. Moreover, the first source electrode 38-1, the second source electrode 38-2, the first drain electrode 39-1 and the second drain electrode 39-2 are provided in the identical layer. Therefore, by adjusting the layout of a mask used when forming the source electrodes 38-1 and 38-2 and the drain electrodes 39-1 and 39-2, the existence or non-existence of the offset region 82 can be determined, and the first transistor 32-1 (P-FET) and the second transistor 32-2 (N-FET) can be manufactured independently and individually. It is not necessary to manufacture the first transistor 32-1 and the second transistor 32-2 in the different processes. The inverter 40 can be obtained without increasing a manufacturing cost.

Figure 18:
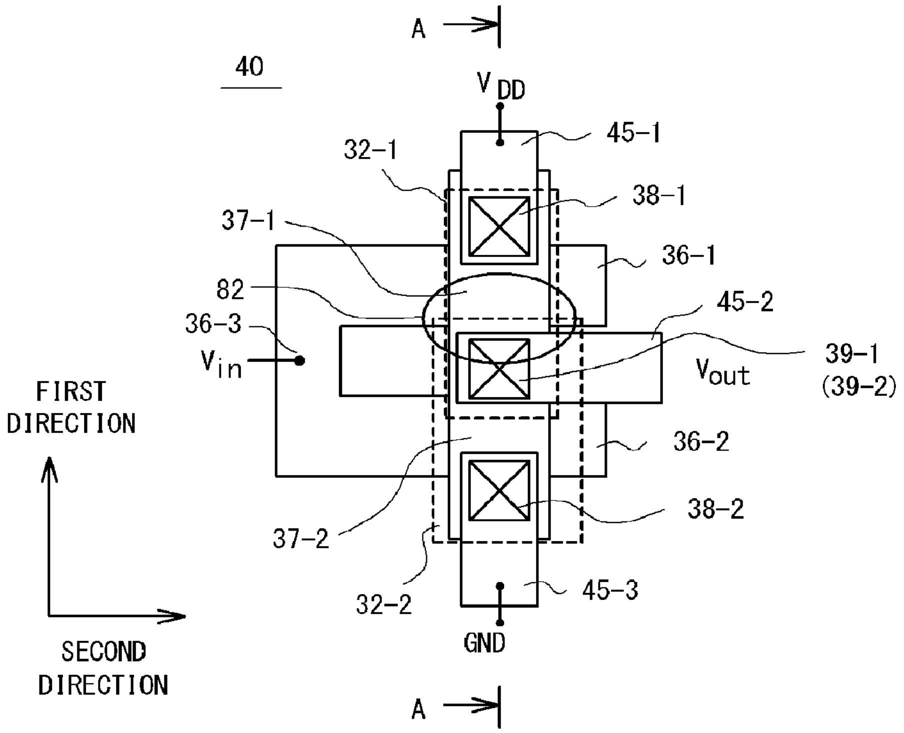
FIG. 18 is a plan showing an inverter.

Next, the structure of the inverter 40 will be described in detail. FIG. 18 is a plan view showing the inverter 40.

The first direction and the second direction are defined in FIG. 18. The first direction and the second direction are parallel to the semiconductor substrate. The first direction is perpendicular to the second direction.

As mentioned above, the first transistor 32-1 has the first gate electrode 36-1, the first p-type metal oxide semiconductor region 37-1, the first source electrode 38-1 and the first drain electrode 39-1. Also, the second transistor 32-2 has the second gate electrode 36-2, the second p-type metal oxide semiconductor region 37-2, the second source electrode 38-2 and the second drain electrode 39-2.

The first gate electrode 36-1 and the second gate electrode 36-2 extend along the second direction, respectively. The first gate electrode 36-1 and the second gate electrode 36-2 are connected through the gate connection section 36-3 which extends along the first direction. A gate connection section 36-3 is connected with the input terminal Vin.

The first p-type metal oxide semiconductor region 37-1 is continuous to the second p-type metal oxide semiconductor region 37-2. The first p-type metal oxide semiconductor region 37-1 and the second p-type metal oxide semiconductor region 37-2 extend along the first direction. The first p-type metal oxide semiconductor region 37-1 intersects with the first gate electrode 36-1. The second p-type metal oxide semiconductor region 37-2 intersects with the second gate electrode 36-2.

The first source electrode 38-1 and the first drain electrode 39-1 are connected with the first p-type metal oxide semiconductor region 37-1. The first source electrode 38-1 and the first drain electrode 39-1 are arranged in the positions to put the first gate electrode 36-1 between them in the top view. The first source electrode 38-1 and the first gate electrode 36-1 overlap partially in the top view. On the other hand, the second drain electrode 39-1 and the first gate electrode 36-1 are separated from each other in the top view. That is, the offset region 82 is provided in the first transistor 31-1. The first source electrode 38-1 is connected with the power supply voltage VDD through the upper wiring line 45-1. The first drain electrode 39-1 is connected with the output terminal Vout through an upper wiring line 45-2.

The second source electrode 38-2 and the second drain electrode 39-2 are connected with the second p-type metal oxide semiconductor region 37-2. Here, the second drain electrode 39-2 is identical (common) to the first drain electrode 39-1. The second source electrode 38-2 and the second drain electrode 39-2 are arranged in the positions to put the second gate electrode 36-2 between them. The second source electrode 38-2 and the first gate electrode 36-2 overlap partially in the top view. Also, the second drain electrode 39-2 and the second gate electrode 36-2 overlap partially in the top view. That is, the offset region is not provided. The second source electrode 38-2 is connected with the ground voltage (the second power supply) through an upper wiring line 45-3.

Figure 19:
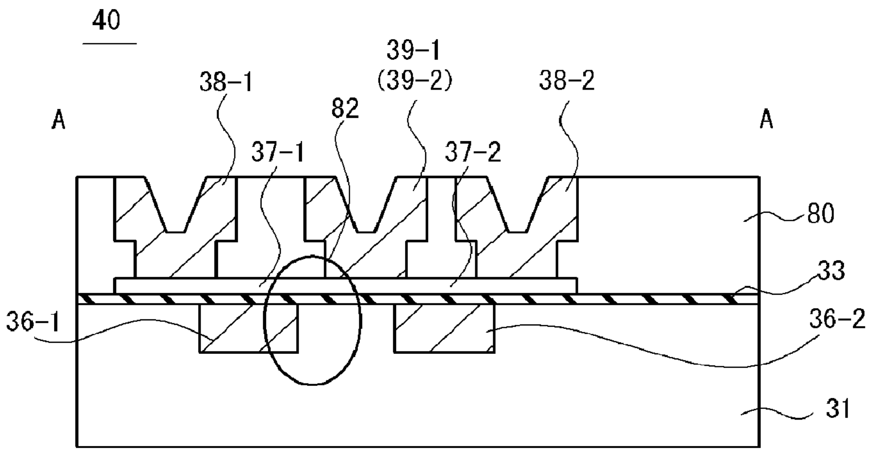
FIG. 19 is a sectional view of a section along the line A-A in FIG. 18.

Next, the sectional structure of the inverter 40 will be described. FIG. 19 is a sectional view along the line A-A section in FIG. 18. As shown in FIG. 19, the inverter 40 is a back gate-type inverter.

As shown in FIG. 19, the inverter 40 is provided on the insulating layer 31.

The first gate electrode 36-1 and the second gate electrode 36-2 are arranged on the insulating layer 31 so as to be embedded in the insulating layer 31. As these gate electrodes, for example, the Cu wiring line and the Al wiring line can be used.

The gate insulating film 33 is provided on the insulating layer 31 to cover the first gate electrode 36-1 and the second gate electrode 36-2.

A p-type metal oxide semiconductor layer 37 (the first p-type metal oxide semiconductor region 37-1 and the second p-type metal oxide semiconductor region 37-2) is provided on the gate insulating film 33. As the p-type metal oxide semiconductor layer 37, the SnO layer, the doped ZnO layer, the ZnAlO layer, the ZnCuO layer, the NiO layer, and the $Cu_2O$ layer are desirably used like the above-mentioned embodiments.

The p-type metal oxide semiconductor layer 37 is covered by an insulating film 80 (the interlayer insulating film).

The first source electrode 38-1, the second source electrode 38-2, the first drain electrode 39-1 (the second drain electrode 39-2) are embedded in the insulating film 80, respectively, and are connected with the p-type metal oxide semiconductor layer 37.

Next, the operation of the inverter 40 will be described. When the input signal Vin is supplied to the input terminal Vin, the first transistor 32-1 and the second transistor 32-2 operate respectively according to the voltage and an inverted signal of the signal Vin is outputted from the output terminal Vout.

Next, referring to FIG. 19, the manufacturing method of the inverter 40 will be described.

In the inverter 40 according to the present embodiment, the manufacture of the n-type transistor and the p-type transistor is controlled based on the mask design. The methods described in the above embodiments (FIG. 9A to FIG. 9E) are used for the other points.

Specifically, like an example shown in FIG. 9A, the first, the wiring layer (e.g. the Cu wiring layer) which contains the first gate electrode 36-1 and the second gate electrode 36-2 is formed on the insulating layer 31. Moreover, on this wiring layer, a gate insulating film 33 is formed. The gate insulating film 33 functions as the Cu diffusion preventing film. For example, as the gate insulating film 33, the SiN film and the SiCN film are used. The film thickness of the Cu diffusion preventing film is, desirably, 10-50 nm.

Next, like an example shown in FIG. 9B, the p-type oxide semiconductor layer 37 is formed on the gate insulating film 33. As the p-type oxide semiconductor layer 37, the doped ZnO layer, the ZnAlO layer, the ZnCuO layer, the NiO layer, the SnO layer and the Cu2O layer are desirably used. Desirably, the film thickness of the p-type oxide semiconductor layer 37 is 10-50 nm. The oxide semiconductor layer 37 may be crystalline or may be in an amorphous condition.

Next, like an example shown in FIG. 9C, a hard mask is formed on the p-type oxide semiconductor layer 37, and the hard mask is patterned through a photolithography process and a dry etching process. For example, as the material of the hard mask, the insulating film such as a $SiO_2$ film, a SiOC film, a C film and a SiN film or a combination of them can be used. Desirably, the film thickness of the hard mask is about 30 to 200 nm. After processing of the hard mask, a resist film is peeled off. After that, the p-type oxide semiconductor layer 37 is patterned based on a pattern of the hard mask. Thus, the first p-type metal oxide semiconductor region 37-1 and the second p-type metal oxide semiconductor region 37-2 are formed.

It should be noted that heat-treatment (PDA) is carried out for the purpose of the semiconductor characteristic appearance. As the temperature of the PDA, a temperature range from 200° C. to 400° C. is desirable and a temperature range from 250° C. to 380° C. is more desirable. As a result of the study, it is desirable to perform the PDA in any of the following steps (1) to (5):

(1) after forming the p-type oxide semiconductor layer 37 film;
(2) immediately after forming the hard mask on the p-type oxide semiconductor layer 37;
(3) after processing the hard mask;
(4) after processing of the p-type oxide semiconductor layer 37; and
(5) after forming the insulating film 80.

Next, like an example shown in FIG. 9D, the insulating film 80 is formed to cover the first p-type metal oxide semiconductor region 37-1 and the second p-type metal oxide semiconductor region 37-2. Moreover, like an example shown in FIG. 9E, the openings for the source electrodes (39-1 and 39-2) and the drain electrodes (39-1 and 39-2) are formed in the insulating film 80. It should be noted that because the first drain electrode 39-1 and the second drain electrode 39-2 are identical, the opening for the first drain electrode 39-1 and the opening for the second drain electrode 39-2 are identical.

After that, conductive material is formed on an insulating film 80 to fill the openings with it.

Moreover, by patterning the conductive material, the source electrodes (38-1 and 38-2) and the drain electrodes (39-1 and 39-2) are formed. It should be noted that the positioning process is carried out based on the first gate electrode 36-1 and the second gate electrode 36-2, and then the lithography process is carried out, and it becomes possible to control the position relation of each of the drain electrodes (39-1 and 39-2) and each of the gate electrodes (36-1 and 36-2) in the precision which is prescribed in the lithography. Also, in this case, an offset quantity is prescribed based on the position relation of each of the gate electrodes (36-1 and 36-2) and each of the drain electrodes (39-1 and 39-2). By designing a mask layout such that the length d of the offset region 82 is negative, the drain electrodes (39-1 and 39-2) and the gate electrodes (36-1 and 36-2) can be designed to overlap in the top view so that the n-type transistor can be obtained. On the other hand, if designing the mask layout such that the length d of the offset region 82 is positive, the drain electrodes (39-1 and 39-2) and the gate electrodes (36-1 and 36-2) can be arranged to be separated from each other in the top view so that the p-type transistor can be obtained.

Through the above processes, the inverter 40 according to the present embodiment can be obtained.

Next, the function of the present embodiment will be described. As mentioned above, the oxidation number changes when the p-type metal oxide semiconductor material is exposed to the atmosphere. Thus, it is expected that the p-type material changes into the n-type material. That is, when the openings corresponding to the source electrodes (38-1 and 38-2) and the drain electrodes (39-1 and 39-2) are formed in the process of the manufacture, the p-type metal oxide semiconductor material has changed into the n-type semiconductor in that part. When the n-type component is generated in the drain electrode (39-1 and 39-2) that a drain voltage is applied, the device structure is formed in which n-type carriers are injected into the channel. It could be considered that as a result, the n-type characteristic appears in case of operation of the transistor. On the other hand, if the offset region 82 is provided between the drain electrodes and the gate electrodes, a region (a channel portion) which faces the gate electrode 36-2 and the drain portion are physically separated in the p-type metal oxide semiconductor layer 37 due to the offset region as the p-type semiconductor region. As a result, the probability that the n-type carriers are directly injected to the channel portion is greatly reduced. Thus, the n-type characteristic is restrained. It should be noted that the probability that the n-type carriers are injected into the channel depends on the length of the offset region 82.

In the present embodiment, the above-mentioned effect of the offset region 82 is used. The p-type active wiring line element having a desired ON/OFF ratio is made possible to be formed by providing the offset region. On the other hand, by designing the gate electrode and the drain electrode to overlap with each other, the n-type active wiring line device having enough characteristics as the inverter is made possible to be formed.

As described above, according to the present embodiment, the p-type transistor and the n-type transistor can be produced independently and separately by use of a single mask, and the CMOS circuit can be realized. Also, according to the present embodiment, because the ON/OFF ratio of the p-type transistor can be increased, the amplitude of the output voltage Vout of the inverter 40 can be increased.

[Seventh Embodiment]

Next, a seventh embodiment of the present invention will be described.

Figure 20:
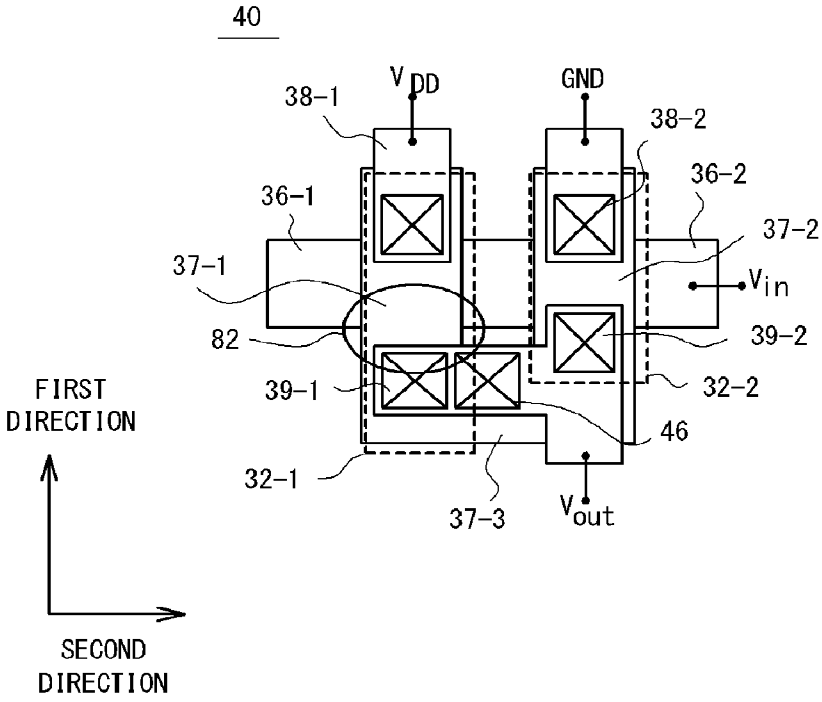
FIG. 20 is a diagram showing an inverter according to a seventh embodiment in a top view.

FIG. 20 is a top view of the inverter 40 according to the present embodiment. In the present embodiment, the layout of each of the gate electrodes (36-1 and 36-2) is changed from that of the sixth embodiment. Also, a coupling p-type metal oxide semiconductor region 37-3 and an auxiliary electrode 46 are added. Because the other points are same as those of the sixth embodiment, the detailed explanation is omitted.

The first direction and the second direction are defined in FIG. 20 to orthogonalize to each other. The first gate electrode 36-1 and the second gate electrode 36-2 extend along the second direction and are in a continue state. The first p-type metal oxide semiconductor region 37-1 and the second p-type metal oxide semiconductor region 37-2 extend along the first direction, respectively. The first p-type metal oxide semiconductor region 37-1 intersects with the first gate electrode 36-1, and the second p-type metal oxide semiconductor region 37-2 intersects with the second gate electrode 36-2.

The first source electrode 38-1 and the first drain electrode 39-1 are arranged in the positions to put the first gate electrode 36-1 between them in the first direction. In the top view, the first drain electrode 39-1 is separated from the first gate electrode 36-1. That is, the offset region 82 is provided for the first p-type metal oxide semiconductor layer 37-1.

The second source electrode 38-2 and the second drain electrode 39-2 are arranged in the positions to put the second gate electrode 36-2 between them in the first direction. In the top view, the second drain electrode 39-2 overlaps partially with the second gate electrode 36-2.

The coupling p-type metal oxide semiconductor region 37-3 is arranged to couple the first p-type metal oxide semiconductor region 37-1 and the second p-type metal oxide semiconductor region 37-2. The coupling p-type metal oxide semiconductor region 37-3 is provided in the same layer as the p-type metal oxide semiconductor regions (37-1 and 37-2) and extends into the second direction. The coupling p-type metal oxide semiconductor region 37-3 is arranged is arranged to couple the first drain electrode 39-1 and the second drain electrode 39-2 in the top view.

The auxiliary electrode 46 is an electrode which is different from the first drain electrode 39-1 and the second drain electrode 39-2. The auxiliary electrode 46 is arranged to overlap with the coupling p-type metal oxide semiconductor region 37-3. The auxiliary electrode 46 is connected with the coupling p-type metal oxide semiconductor region 37-3 through the via-contact. Also, the auxiliary electrode 46 is connected with the output terminal Vout. That is, the coupling p-type metal oxide semiconductor region 37-3 is connected with the output terminal Vout through the auxiliary electrode 46.

The other points are the same as those of the sixth embodiment.

According to the present embodiment, the first gate electrode 36-1 and the second gate electrode 36-2 extend along the second direction. The first gate electrode 36-1 and the second gate electrode 36-2 are provided in the identical wiring layer. Wiring lines except the gate electrode are provided in this wiring layer. Because the first gate electrode 36-1 and the second gate electrode 36-2 extend in a straight line, the other wiring lines are easy to arrange.

Also, according to the present embodiment, the coupling p-type metal oxide semiconductor region 37-3 is provided to be parallel to the gate electrodes 36-1 and 36-2. Therefore, the drain and the output terminal Vout in each transistor (32-1 and 32-2) can be connected through more via-contacts. That is, the auxiliary electrode 46 can be added. Thus, the parasitic resistance in the output section of the inverter 40 can be reduced.

[Eighth Embodiment]

Next, an eighth embodiment of the present invention will be described.

Figure 21:
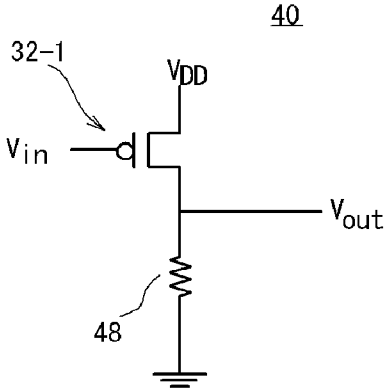
FIG. 21 is a diagram schematically showing the inverter according to an eighth embodiment.

FIG. 21 is a circuit diagram showing the inverter 40 according to the present embodiment. The inverter 40 is composed of the first transistor 32-1 and a resistance element 48. That is, in the present embodiment, the second transistor 32-2 is replaced with the resistance element 48 in the inverter 40 which has been described in the sixth embodiment (see FIG. 16). Because the structure like the sixth embodiment can be adopted as to the other points, a detailed explanation is omitted.

Figure 22:
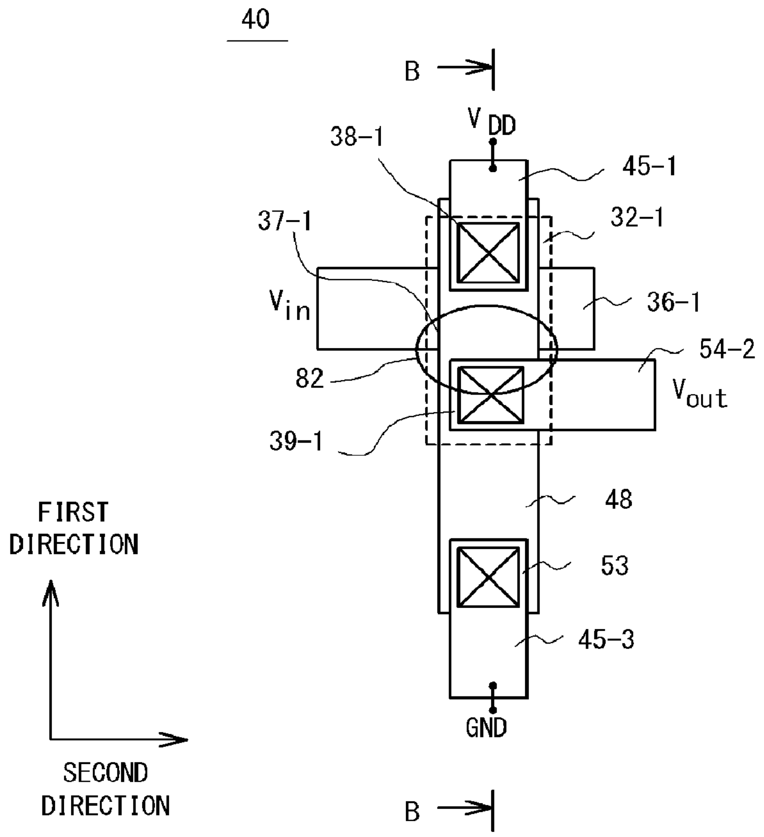
FIG. 22 is a diagram showing the inverter according to the eighth embodiment in the top view.
Figure 23:
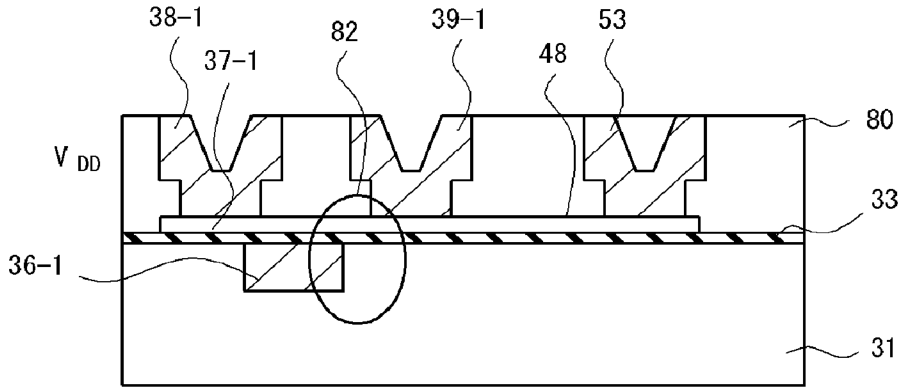
FIG. 23 is a sectional view showing a section along the line B-B in FIG. 22.

FIG. 22 is a diagram of the inverter 40 according to the present embodiment in the top view. The first direction and the second direction are defined in FIG. 22 to orthogonalize to each other. Also, FIG. 23 is a sectional view showing a section along the line B-B in FIG. 22.

As shown in FIG. 22, the first transistor 32-1 is provided with the first gate electrode 36-1, the first p-type metal oxide semiconductor region 37-1, the first source electrode 38-1 and the first drain electrode 39-1. The first gate electrode 36-1 extends along the second direction. The first p-type metal oxide semiconductor region 37-1 extends along the first direction and intersects with the first gate electrode 36-1. The first source electrode 38-1 and the first drain electrode 39-1 are arranged to put the first gate electrode 36-1 between them in the first direction. The first gate electrode 36-1 and the first drain electrode 39-1 are separated from each other in the top view. That is, the offset region 82 is provided in the first p-type metal oxide semiconductor region 37-1.

The first gate electrode 36-1 is connected with the input terminal Vin and the first drain electrode 39-1 is connected with the output terminal Vout. The first source electrode 38-1 is connected with the first the power supply voltage VDD.

The resistance element 48 extends along the first direction. The resistance element 48 is realized by the first p-type metal oxide semiconductor region 37-1 and the second p-type metal oxide semiconductor region continuing to it. The resistance element 48 is connected with the ground GND through the electrode 53. That is, the resistance element 48 is connected with the first drain electrode 39-1 at its one end and is connected with the second power GND at its other end.

As shown in FIG. 23, the first gate electrode 36-1 is provided in the surface portion of the insulating layer 31 to be embedded in the insulating layer 31. The gate insulating film 33 is provided on the first gate electrode 36-1 and the first p-type metal oxide semiconductor layer 37-1 and the resistance element 48 are arranged on the gate insulating film 33. The first p-type metal oxide semiconductor layer 37-1 and the resistance element 48 are covered with the insulating layer 80. The first drain electrode 38-1, the first source electrode 39-1 and the electrode 53 are provided to be embedded in the insulating layer 80.

In the present embodiment, the gate electrode (the first gate electrode 36-1) is arranged in a portion below the first transistor 32-1. Thus, a load resistance-type inverter is realized. According to the present embodiment, it is not necessary to connect the n-type transistor and the p-type transistor. Also, because the resistance of the resistance element 48 which is the p-type semiconductor film is small, the sufficiently large amplitude can be obtained as the amplitude of output voltage Vout.

[Ninth Embodiment]

Next, a ninth embodiment of the present invention will be described. In the present embodiment, the structure of the first transistor 32-1 is changed in sixth embodiment.

Figure 24:
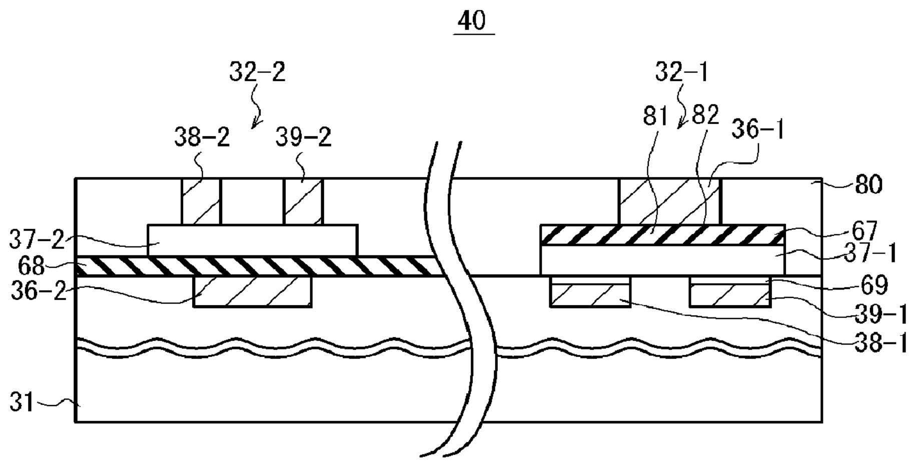
FIG. 24 is a sectional view schematically showing the inverter according to a ninth embodiment.

FIG. 24 is a sectional view showing the inverter 40 according to the present embodiment. As shown in FIG. 24, the inverter 40 has the first transistor 32-1 and the second transistor 32-2. The structure of the second transistor 32-2 is the same as that of the sixth embodiment (reference to FIG. 17).

In the first transistor 32-1, the first source electrode 38-1 and the first drain electrode 39-1 are provided in the surface portion of the insulating layer 31 to be embedded in the insulating layer 31. The first source electrode 38-1 and the first drain electrode 39-1 are provided in the same wiring layer as the second gate electrode 36-2 of the second transistor 32-2.

Also, a cap layer 69 is provided on the first source electrode 38-1 and the first drain electrode 39-1. For example, as the cap layer 69, a CoWB layer and a CoWP layer can be used.

The first p-type metal oxide semiconductor layer 37-1 is provided on the wiring layer in which the first source electrode 38-1 has been formed.

A first gate insulating film 67 is provided on the first p-type metal oxide semiconductor layer 37-1. The first p-type metal oxide semiconductor layer 37-1 is covered with the insulating film 80.

The first gate electrode 36-1 is arranged on the first p-type metal oxide semiconductor region 37-1 through the first gate insulating film 67. The first gate electrode 36-1 is embedded in the insulating film 80 like the second source electrode 38-2 and the second drain electrode 39-2.

The first gate electrode 36-1 and the first drain electrode 39-1 overlap partially with each other. That is, the offset region is not provided.

The inverter 40 according to the present embodiment can be manufactured in the same method as in the sixth embodiment. Specifically, first, the wiring layer which contains the first source electrode 38-1, the first drain electrode 39-1, and the second gate electrode 36-1 is formed in an identical process. Also, the cap layer 69 is provided on the first source electrode 38-1 and the first drain electrode 39-1. Next, the gate insulating film 68 is formed on the wiring layer in the formation scheduled region of the second transistor 32-2. Moreover, the processing is carried out in such a manner that the p-type metal oxide semiconductor layer is formed and the first p-type metal oxide semiconductor region 37-1 and the second p-type metal oxide semiconductor region 37-2 are formed. Moreover, the gate insulating film 67 is formed on the first p-type metal oxide semiconductor region 37-1. After that, the insulating film 80 (the interlayer insulating film) is formed to cover the first p-type metal oxide semiconductor region 37-1 and the second p-type metal oxide semiconductor region 37-2. Next, an opening for the second source electrode 38-2, an opening for the second drain electrode 39-2 and an opening for the first gate electrode 36-1 are formed in the insulating film 80. In this case, each opening is formed such that the second p-type metal oxide semiconductor region 37-2 is exposed in the formation scheduled region of the second transistor 32-2 at least. Next, the conductive material is filled in the formed openings and the second source electrode 38-2, the second drain electrode 39-2 and the first gate electrode 36-1 are attained.

According to the present embodiment, the first p-type metal oxide semiconductor region 37-1 is provided on the first source electrode 38-1 and the first drain electrode 39-1. Therefore, in case of manufacturing, a connection part with the first source electrode 39-1 is not exposed to the atmosphere in the first p-type metal oxide semiconductor region 37-1. The connection part with the first drain electrode 38-1 in the first p-type metal oxide semiconductor region 37-1 is also the same. Therefore, the change of the oxidation number does not happen in the first p-type metal oxide semiconductor region 37-1. Therefore, although the offset region is not provided, it is possible to operate the first transistor 32-1 as the p-type transistor. Thus, it is possible to reduce the ON resistance of the first transistor.

Next, a layout example of the present embodiment will be described.

Figure 25:
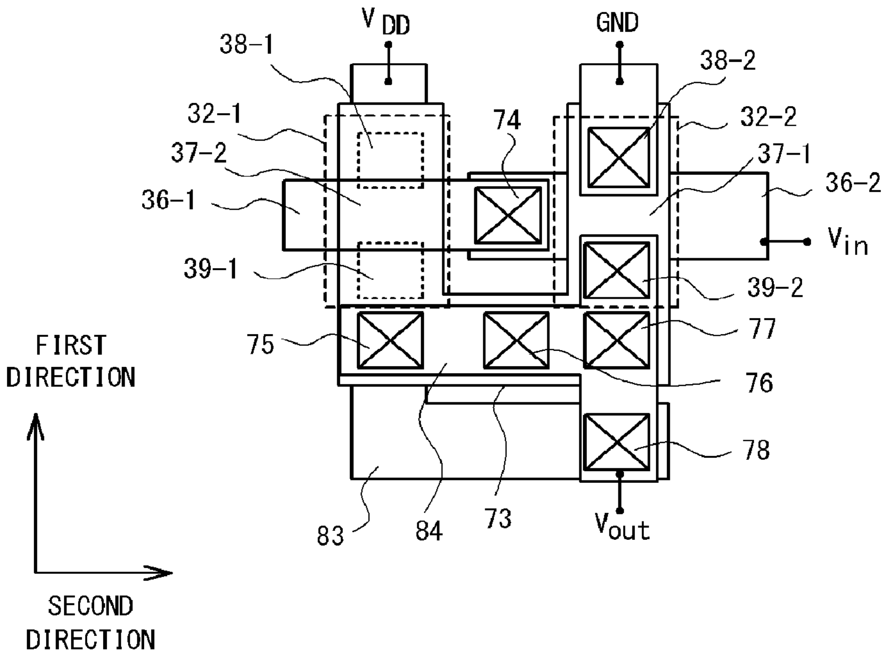
FIG. 25 is a plan view schematically showing an example of the inverter according to a tenth embodiment.

FIG. 25 is a plan view schematically showing an example of the inverter 40 according to the present embodiment. The first direction and the second direction are defined in FIG. 25 as the direction to orthogonalize to each other.

The first gate electrode 36-1 extends along the second direction. The second gate electrode 36-2 extends along the second direction. The first gate electrode 36-1 and the second gate electrode 36-2 are arranged to be on the same line in the top view. The first gate electrode 36-1 and the second gate electrode 36-2 are connected through an electrode 74.

The first p-type metal oxide semiconductor region 37-1 and the second p-type metal oxide semiconductor region 37-2 extend along the first direction. The first p-type metal oxide semiconductor region 37-1 intersects with the first gate electrode 36-1. The second p-type metal oxide semiconductor region 37-2 intersects with the second gate electrode 36-2.

The first source electrode 38-1 and the first drain electrode 39-1 are arranged to put the first gate electrode 36-1 between them in the first direction. The first source electrode 38-1 is connected with the power supply voltage VDD, and the first drain electrode 39-1 is connected with the wiring line 83, and the wiring line 83 is connected with the output terminal Vout through an electrode 78.

The second source electrode 38-2 and the second drain electrode 39-2 are arranged to put the second gate electrode 36-2 between them in the first direction. The second source electrode 38-2 is connected with the ground voltage, and the second drain electrode 39-2 is connected with the output terminal Vout through the wiring line 84.

The first p-type metal oxide semiconductor region 37-1 and the second p-type metal oxide semiconductor region 37-2 are connected by a coupling p-type metal oxide semiconductor region 73. The coupling p-type metal oxide semiconductor region 73 extends along the second direction. The coupling p-type metal oxide semiconductor region 73 is arranged to connect the first drain electrode 39-1 and the second drain electrode 39-2 in the top view.

The coupling p-type metal oxide semiconductor region 73 is connected with the wiring line 84 through a plurality of electrodes (75, 76 and 77). As mentioned above, the wiring line 84 is connected with the output terminal Vout. That is, the drains of the first transistor 32-1 and the second transistor 32-2 are connected with the output terminal out through the plurality of electrodes (75, 76 and 77). Thus, a parasitic resistance in the output section is reduced.

[Tenth Embodiment]

Next, a tenth embodiment of the present invention will be described.

Figure 26:
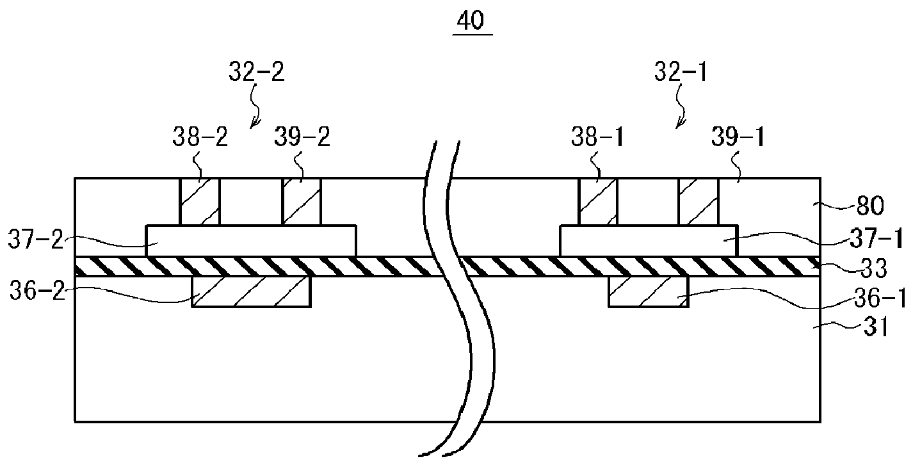
FIG. 26 is a sectional view schematically showing the inverter according to the tenth embodiment.

FIG. 26 is a sectional view schematically showing the inverter 40 according to the present embodiment. In the present embodiment, the offset region is not provided for the first transistor 32-1. That is, in the top view, the first gate electrode 36-1 and the first drain electrode 39-1 overlap with each other. Because the same structure as that of the sixth embodiment (reference to FIG. 17) can be adopted with respect to the other points, a detailed explanation is omitted.

In the present embodiment, a manufacturing method is devised. Specifically, when the openings for the source electrodes (38-1 and 38-2) and the openings for the drain electrodes (39-1 and 39-2) should be formed, the openings are formed to expose the surface of the second p-type metal oxide semiconductor region 37-2 in the formation scheduled region of the second transistor 32-2. On the other hand, the openings are formed such that the insulating film (the cover film) remains on the surface of the first p-type metal oxide semiconductor region 37-1 in the formation scheduled region of the first transistor 32-1. After that, at the time of the RF etching in the sputtering chamber in case of contact formation, a deoxidizing process is generally carried out on the side of the second transistor. On the other hand, on the side of the first transistor, the left cover film is removed and the surface of the first p-type metal oxide semiconductor region 37-1 is exposed. After that, in each opening, a conductive material is filled.

In the present embodiment, it can be prevented that the first p-type metal oxide semiconductor layer 37-1 is exposed to the atmosphere in case of forming the openings for the source electrodes (38-1 and 38-2) and the openings for the drain electrodes (39-1 and 39-2) like the ninth embodiment, and it is possible to operate the first transistor 32-1 as the p-type transistor.

According to the present embodiment, because it is not necessary to provide the offset region, the constraint of the design is eased.

It should be noted that the film thickness of the hard mask (the cover film) formed on the p-type metal oxide semiconductor regions (37-1 and 37-2) should be adjusted in advance by a patterning and an etching processes before the openings are formed, in order to form the openings in such a manner that the insulating film (the cover film) remains on the surface portion of the first p-type metal oxide semiconductor region 37-1.

As described above, the present invention has been described specifically with reference to the embodiments. However, the present invention is not limited to the embodiments and a modification example which does not deviate from the scope of the present is included in the present invention.

<Note>

(Note 1)

A semiconductor device includes:

a p-type metal oxide semiconductor layer;

a source electrode connected with the p-type metal oxide semiconductor layer;

a drain electrode connected with the p-type metal oxide semiconductor layer; and a gate electrode arranged to oppose to a part of the p-type metal oxide semiconductor layer, wherein the gate electrode and the drain electrode are separated from each other in a top view.

(Note 2)

The semiconductor device according to note 1, wherein the p-type metal oxide semiconductor layer contains metal oxide which shows n-type semiconductor characteristics when an oxidation number is changed.

(Note 3)

The semiconductor device according to note 2, wherein the p-type metal oxide semiconductor layer contains a SnO layer or a Cu2O layer.

(Note 4)

The semiconductor device according to note 1, wherein a distance between the gate electrode and the drain electrode is equal to or longer than a length of the gate electrode in the top view.

(Note 5)

The semiconductor device according to note 1, further including:

a first insulating layer;

a first wiring layer formed in a surface portion of the first insulating layer to be embedded in the first insulating layer; and a gate insulating film formed on the first insulating layer, wherein the p-type metal oxide semiconductor layer is formed on the gate insulating film, wherein the gate electrode is provided in the first wiring layer; and wherein the source electrode and the drain electrode are provided on the p-type semiconductor layer.

(Note 6)

The semiconductor device according to note 1, wherein the gate electrode contains Cu or Al.

(Note 7)

The semiconductor device according to note 1, wherein the p-type metal oxide semiconductor layer is in a crystalline or polycrystalline condition.

(Note 8)

The semiconductor device according to note 1, wherein the p-type metal oxide semiconductor layer is in an amorphous condition.

(Note 9)

A semiconductor device manufacturing method includes:

forming a p-type metal oxide semiconductor layer;

forming a gate electrode to oppose to a part of the p-type metal oxide semiconductor layer; and forming a source electrode and a drain electrode to be connected with the p-type metal oxide semiconductor layer, wherein the forming a source electrode and a drain electrode includes:

forming the source electrode and the drain electrode such that, in a top view, the gate electrode is put between the source electrode and the drain electrode and the gate electrode and the drain electrode are separated from each other.

(Note 10)

The semiconductor device manufacturing method according to note 9, wherein the forming the p-type metal oxide semiconductor layer includes:

forming the p-type metal oxide semiconductor film by a sputtering method; and heating the p-type metal oxide semiconductor film to change into the polycrystalline condition, after the forming by the sputtering method.

(Note 11)

The semiconductor device manufacturing method according to note 9, wherein the forming the p-type metal oxide semiconductor layer includes:

forming the p-type metal oxide semiconductor film by a sputtering method; and heating the p-type metal oxide semiconductor film such that an amorphous condition is maintained, after the forming by the sputtering method.

(Note 12)

The semiconductor device manufacturing method according to note 9, further including:

determining a manufacturing condition such that as previously set target threshold voltage is obtained, wherein the forming the p-type metal oxide semiconductor layer includes forming the p-type metal oxide semiconductor layer in the determined manufacturing condition.

(Note 13)

The semiconductor device manufacturing method according to note 12, wherein the forming the p-type metal oxide semiconductor layer includes:

depositing the p-type metal oxide semiconductor film by a sputtering method;

heating the p-type metal oxide semiconductor film after the forming by the sputtering method; and determining a heating temperature for the heating as the manufacture condition.

(Note 14)

The semiconductor device manufacturing method according to note 12, wherein the forming the p-type metal oxide semiconductor layer includes forming the p-type metal oxide semiconductor film by a sputtering method, and wherein the determining includes determining an oxygen concentration for the forming by the sputtering as the manufacture condition.

(Note 15)

A semiconductor device includes:

a p-type metal oxide semiconductor layer;

a source electrode connected with the p-type metal oxide semiconductor layer;

a drain electrode connected with the p-type metal oxide semiconductor layer;

a gate electrode arranged to oppose to a part of the p-type metal oxide semiconductor layer; and a gate insulating film provided between the gate electrode and the p-type metal oxide semiconductor layer, wherein the gate insulating film includes:

a first gate insulating film; and a second insulating film provided on the first gate insulating film and having a band gap larger than that of the first gate insulating film.

(Note 16)

The semiconductor device according to note 15, wherein the gate electrode includes a Cu layer, wherein the first gate insulating film is a Cu diffusion preventing film on the gate electrode, and wherein the second gate insulating film is provided between the Cu diffusion preventing film and the p-type metal oxide semiconductor layer.

(Note 17)

A semiconductor device includes:

a first transistor; and a second transistor, wherein the first transistor includes:

a first p-type metal oxide semiconductor region;

a first source electrode connected with the first p-type metal oxide semiconductor region;

a first drain electrode connected with the first p-type metal oxide semiconductor region; and a first gate electrode arranged to oppose to a part of the first p-type metal oxide semiconductor region, wherein the first gate electrode is arranged between the first source electrode and the first drain electrode in a top view, and the first gate electrode and the first drain electrode are separated from each other in the top view, wherein the second transistor includes:

a second p-type metal oxide semiconductor region;

a second source electrode connected with the second p-type metal oxide semiconductor region;

a second drain electrode connected with the second p-type metal oxide semiconductor region; and a second gate electrode arranged to oppose to a part of the second p-type metal oxide semiconductor region, wherein the second gate electrode is arranged between the second source electrode and the second drain electrode in the top view, and the second gate electrode and the second drain electrode overlap with each other in the top view, wherein the first p-type metal oxide semiconductor region and the second p-type metal oxide semiconductor region are provided in an identical layer, and the first p-type metal oxide semiconductor region and the second p-type metal oxide semiconductor region are covered with an insulating film, and wherein the first source electrode, the first drain electrode, the second source electrode and the second drain electrode are embedded in the insulating film, and the first gate electrode and the second gate electrode are provided in a same layer.

(Note 18)

The semiconductor device according to note 17, wherein the first gate electrode and the second gate electrode are connected with an input terminal, and the first drain electrode and the second drain electrode are connected with an output terminal.

(Note 19)

The semiconductor device according to note 18, wherein the first p-type metal oxide semiconductor region and the second p-type metal oxide semiconductor region are continuous, and wherein the first drain electrode and the second drain electrode are identical.

(Note 20)

The semiconductor device according to note 19, wherein the first p-type metal oxide semiconductor region and the second p-type metal oxide semiconductor region extends along a first direction in a stop view, wherein the first gate electrode extends along a second direction orthogonal to the first direction to intersect with the first p-type metal oxide semiconductor region, and wherein the second gate electrode extends along the second direction to intersect with the second p-type metal oxide semiconductor region.

(Note 21)

The semiconductor device according to note 18, further comprises:

a coupling p-type metal oxide semiconductor region extending along the second direction to connect the first p-type metal oxide semiconductor region and the second p-type metal oxide semiconductor region, wherein the first gate electrode and the second gate electrode extend along the second direction and and are continuous, wherein the first p-type metal oxide semiconductor region extends along the first direction orthogonal to the second direction to intersect with the first gate electrode, and the second p-type metal oxide semiconductor region extends along the first direction to intersect with the second gate electrode, and wherein the coupling p-type metal oxide semiconductor region is connected with an output terminal through an auxiliary electrode different from the first drain electrode and the second drain electrode.

(Note 22)

A manufacturing method of a semiconductor device which includes:

a first transistor; and a second transistor, wherein the first transistor includes:

a first p-type metal oxide semiconductor region;

a first source electrode connected with the first p-type metal oxide semiconductor region;

a first drain electrode connected with the first p-type metal oxide semiconductor region; and a first gate electrode arranged to oppose to a part of the first p-type metal oxide semiconductor region, wherein the first gate electrode is arranged between the first source electrode and the first drain electrode, and the first gate electrode and the first drain electrode are separated from each other in a top view, wherein the second transistor includes:

a second p-type metal oxide semiconductor region;

a second source electrode connected with the second p-type metal oxide semiconductor region;

a second drain electrode connected with the second p-type metal oxide semiconductor region; and a second gate electrode arranged to oppose to a part of the second p-type metal oxide semiconductor region, wherein the second gate electrode is arranged between the second source electrode and the second drain electrode, and the second gate electrode and the second drain electrode overlap partially in the top view, wherein the first p-type metal oxide semiconductor region and the second p-type metal oxide semiconductor region are provided in a same layer, and the first p-type metal oxide semiconductor region and the second p-type metal oxide semiconductor region are covered with an insulating film, and wherein the first source electrode, the first drain electrode, the second source electrode and the second drain electrode are embedded in the insulating film, and the first gate electrode and the second gate electrode are provided in a same layer, said semiconductor device manufacturing method including:

forming a wiring layer which contains the first gate electrode and the second gate electrode;

forming the p-type metal oxide semiconductor layer on the wiring layer through the gate insulating film;

carrying out processing on the p-type metal oxide semiconductor layer such that the first p-type metal oxide semiconductor region and the second p-type metal oxide semiconductor region are formed;

forming the insulating film to cover the first p-type metal oxide semiconductor region and the second p-type metal oxide semiconductor region;

forming an opening for the first drain electrode, an opening for the second drain electrode, an opening for the first source electrode and an opening for the second source electrode in the interlayer insulating film; and embedding conductivity material in the opening for the first drain electrode, the opening for the second drain electrode, the opening for the first source electrode and the opening for the second source electrode to form the first drain electrode, the second drain electrode, the first source electrode and the second source electrode.

(Note 23)

The semiconductor device manufacturing method according to note 22, wherein the opening for the first drain electrode and the opening for the second drain electrode are identical, and wherein the first drain electrode and the second drain electrode are identical.

(Note 24)

A semiconductor device including:

a transistor; and a resistance element, wherein the transistor includes:

a first p-type metal oxide semiconductor region;

a source electrode connected with the first p-type metal oxide semiconductor region;

a drain electrode connected with the first p-type metal oxide semiconductor region; and a gate electrode arranged to oppose to a part of the first p-type metal oxide semiconductor region, wherein the gate electrode is arranged between the source electrode and the drain electrode in a top view, and the gate electrode and the drain electrode are separated from each other in the top view, wherein the gate electrode is connected with an input terminal, the drain electrode is connected with an output terminal, and the source electrode is connected with a first power supply, and the resistance element is connected with the drain electrode at one end and is connected with a second power supply at the other end, and wherein the resistance element has a second p-type metal oxide semiconductor region continuous to the first p-type metal oxide semiconductor region.

(Note 25)

A semiconductor device including:

a first transistor; and a second transistor, wherein the first transistor includes:

a first p-type metal oxide semiconductor region;

a first source electrode connected with the first p-type metal oxide semiconductor region;

a first drain electrode connected with the first p-type metal oxide semiconductor region; and a first gate electrode arranged to oppose to a part of the first p-type metal oxide semiconductor region, wherein the first gate electrode is arranged between the first source electrode and the first drain electrode in a top view, and the first gate electrode and the first drain electrode overlap partially in the top view, wherein the second transistor includes:

a second p-type metal oxide semiconductor region;

a second source electrode connected with the second p-type metal oxide semiconductor region;

a second drain electrode connected with the second p-type metal oxide semiconductor region; and a second gate electrode arranged to oppose to a part of the second p-type metal oxide semiconductor region, wherein the second gate electrode is arranged between the second source electrode and the second drain electrode in the top view, and the second gate electrode and the second drain electrode overlap partially in the top view, wherein the first source electrode, the first drain electrode and the second gate electrode are provided in a same wiring layer, and the first p-type metal oxide semiconductor region and the second p-type metal oxide semiconductor region are provided on the wiring layer, and wherein the first p-type metal oxide semiconductor region and the second p-type metal oxide semiconductor region are covered with an insulating film, and the first gate electrode, the second source electrode and the second drain electrode are arranged to be embedded in the insulating film.

(Note 26)

A manufacturing method of a semiconductor device which includes a first transistor and a second transistor, wherein the first transistor includes:

a first p-type metal oxide semiconductor region;

a first source electrode connected with the first p-type metal oxide semiconductor region;

a first drain electrode connected with the first p-type metal oxide semiconductor region; and a first gate electrode arranged to oppose to a part of the first p-type metal oxide semiconductor region, wherein the first gate electrode is arranged between the first source electrode and the first drain electrode in a top view, and the first gate electrode and the first drain electrode overlap partially in the top view, wherein the second transistor includes:

a second p-type metal oxide semiconductor region;

a second source electrode connected with the second p-type metal oxide semiconductor region;

a second drain electrode connected with the second p-type metal oxide semiconductor region; and a second gate electrode arranged to oppose to a part of the second p-type metal oxide semiconductor region, wherein the second gate electrode is arranged between the second source electrode and the second drain electrode, and the second gate electrode and the second drain electrode overlap partially in the top view, wherein the first source electrode, the first drain electrode and the second gate electrode are provided in a same wiring layer, and the first p-type metal oxide semiconductor region and the second p-type metal oxide semiconductor region are provided on the wiring layer, and wherein the first p-type metal oxide semiconductor region and the second p-type metal oxide semiconductor region are covered with an insulating film, and the first gate electrode, the second source electrode and the second drain electrode are arranged to be embedded in the insulating film, wherein the semiconductor device manufacturing method includes:

forming a wiring layer which contains the first source electrode, the first drain electrode and the second gate electrode;

forming the p-type metal oxide semiconductor layer on the said wiring layer;

carrying out processing to the p-type metal oxide semiconductor layer such that the first p-type metal oxide semiconductor region and the second p-type metal oxide semiconductor region are formed;

forming the interlayer insulating film to cover the first p-type metal oxide semiconductor region and the second p-type metal oxide semiconductor region;

forming an opening for the second source electrode, an opening for the second drain electrode and an opening for the first gate electrode in the interlayer insulating film; and embedding the opening for the second source electrode, the opening for the second drain electrode and the opening for the first gate electrode with conductive material to form the second source electrode, the second drain electrode and the first gate electrode, and wherein the forming an opening for the second source electrode, an opening for the second drain electrode and an opening for the first gate electrode includes:

forming the opening for the second source electrode and the opening for the second drain electrode such that the second p-type metal oxide semiconductor region is exposed.

(Note 27)

A manufacturing method of a semiconductor device which includes a first transistor and a second transistor, wherein the first transistor includes:

a first p-type metal oxide semiconductor region;

a first source electrode connected with the first p-type metal oxide semiconductor region;

a first drain electrode connected with the first p-type metal oxide semiconductor region; and a first gate electrode arranged to oppose to the part in the first p-type metal oxide semiconductor region, wherein the first gate electrode is arranged between the first source electrode and the first drain electrode, and the first gate electrode and the first drain electrode overlap partially in a top view, wherein the second transistor includes:

a second p-type metal oxide semiconductor region;

a second source electrode connected with the second p-type metal oxide semiconductor region;

a second drain electrode connected with the second p-type metal oxide semiconductor region; and a second gate electrode arranged to oppose to a part of the second p-type metal oxide semiconductor region, wherein the second gate electrode is arranged between the second source electrode and the second drain electrode, and the second gate electrode and the second drain electrode overlap partially in the top view, wherein the first p-type metal oxide semiconductor region and the second p-type metal oxide semiconductor region are provided in a same layer, and the first p-type metal oxide semiconductor region and the second p-type metal oxide semiconductor region are covered with an insulating film, wherein the first source electrode, the first drain electrode, the second source electrode and the second drain electrode are embedded in the insulating film, and the first gate electrode and the second gate electrode are provided in a same wiring layer, wherein the semiconductor device manufacturing method includes:

forming the wiring layer which contains the first gate electrode and the second gate electrode;

forming the p-type metal oxide semiconductor layer through the gate insulating film on the wiring layer;

carrying out processing to the p-type metal oxide semiconductor layer such that the first p-type metal oxide semiconductor region and the second p-type metal oxide semiconductor region are formed;

forming the insulating film to cover the first p-type metal oxide semiconductor region and the second p-type metal oxide semiconductor region;

forming an opening for the first drain electrode, an opening for the second drain electrode, an opening for the first source electrode and an opening for the second source electrode in the interlayer insulating film; and embedding conductive material in the opening for the first drain electrode, the opening for the second drain electrode, the opening for the first source electrode and the opening for the second source electrode to form the first drain electrode, the second drain electrode, the first source electrode and the second source electrode, and wherein the forming the opening for the first drain electrode, the opening for the second drain electrode, the opening for the first source electrode and the opening for the second source electrode includes:

forming the opening for the second drain electrode and the opening for the second source electrode in a formation scheduled region of the second transistor such that a surface in the second p-type metal oxide semiconductor region is exposed, and forming the opening for the first drain electrode and the opening for the first source electrode such that the interlayer insulating film remains on the surface of the first p-type metal oxide semiconductor region in a formation scheduled region of the first transistor; and carrying out a reduction treatment in the formation scheduled region of the second transistor by the RF etching, to remove the interlayer insulating film which is remained in the opening for the first source electrode and the opening for the first drain electrode in the formation scheduled region of the first transistor.

Although the present invention has described above in connection with several embodiments thereof, it would be apparent to those skilled in the art that those embodiments are provided solely for illustrating the present invention, and should not be relied upon to construe the appended claims in a limiting sense.

The invention claimed is:

1. A semiconductor device comprising:

a first transistor; and a second transistor, wherein the first transistor comprises:

a first p-type metal oxide semiconductor region;

a first source electrode connected with the first p-type metal oxide semiconductor region;

a first drain electrode connected with the first p-type metal oxide semiconductor region; and a first gate electrode arranged to oppose to a part of the first p-type metal oxide semiconductor region, and wherein the first gate electrode is arranged between the first source electrode and the first drain electrode in a top view, and the first gate electrode and the first drain electrode overlap partially in the top view, wherein the second transistor comprises:

a second p-type metal oxide semiconductor region;

a second source electrode connected with the second p-type metal oxide semiconductor region;

a second drain electrode connected with the second p-type metal oxide semiconductor region; and a second gate electrode arranged to oppose to a part of the second p-type metal oxide semiconductor region, wherein the second gate electrode is arranged between the second source electrode and the second drain electrode in the top view, and the second gate electrode and the second drain electrode overlap partially in the top view, wherein the first source electrode, the first drain electrode and the second gate electrode are provided in a same wiring layer, wherein the first p-type metal oxide semiconductor region and the second p-type metal oxide semiconductor region are provided on the wiring layer, and the first p-type metal oxide semiconductor region and the second p-type metal oxide semiconductor region are covered with an insulating film, and wherein the first gate electrode, the second source electrode and the second drain electrode are arranged to be embedded in the insulating film.

* * * * *